US009523735B2

(12) United States Patent
Zeise et al.

(10) Patent No.: US 9,523,735 B2
(45) Date of Patent: *Dec. 20, 2016

(54) ELECTRICAL TEST SYSTEM WITH VISION-GUIDED ALIGNMENT

(71) Applicant: Eastman Kodak Company, Rochester, NY (US)

(72) Inventors: Eric Karl Zeise, Pittsford, NY (US); Thomas A. LeBlanc, Rochester, NY (US); Kevin Michael O'Connor, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 22 days.

This patent is subject to a terminal disclaimer.

(21) Appl. No.: 14/509,272

(22) Filed: Oct. 8, 2014

(65) Prior Publication Data

US 2016/0103175 A1    Apr. 14, 2016

(51) Int. Cl.
*G01R 1/067*   (2006.01)
*G01R 31/308*   (2006.01)
(Continued)

(52) U.S. Cl.
CPC ........... *G01R 31/2891* (2013.01); *G01B 11/14* (2013.01); *G01R 1/0408* (2013.01); *G01R 1/07364* (2013.01); *G01R 31/2808* (2013.01); *G01R 31/2818* (2013.01); *G01R 31/2887* (2013.01); *G06F 3/044* (2013.01); *G06F 3/0412* (2013.01); *G06T 7/001* (2013.01); *G06T 7/0044* (2013.01); *H05K 1/0266* (2013.01);
(Continued)

(58) Field of Classification Search
CPC .............. G01R 31/2891; G01R 1/0408; G01R 1/07364; G01R 31/2887; G01R 31/2808; G01R 31/2818; G01B 11/14; G06F 3/044; G06F 2203/04101; G06F 2203/04111; G06T 7/001; G06T 2207/10004; H05K 1/0266; H05K 1/0268
USPC .......................... 324/750.02, 755.01, 750.23
See application file for complete search history.

(56) References Cited

U.S. PATENT DOCUMENTS 5,321,351 A    6/1994   Swart et al.
5,442,299 A    8/1995   Caggiano
(Continued)

FOREIGN PATENT DOCUMENTS

WO        02/21893        3/2002
WO        2013/063188     5/2013

*Primary Examiner* — Farhana Hoque
(74) *Attorney, Agent, or Firm* — Kevin E. Spaulding

(57) ABSTRACT

An electrical testing system is adapted to perform electrical tests on devices fabricated on successive frames of a web of substrate, each frame including a plurality of fiducial marks. A digital imaging system captures a digital image of a frame, which is analyzed to determine spatial relationships between positions of a set of test pads and positions of the fiducial marks. The frame is advanced to an electrical test fixture which includes a set of test probes adapted to make electrical contact with the test pads. A fiducial sensing system including a plurality of fiducial sensors determines positions of the fiducial marks. The position of the electrical test fixture is adjusted responsive to the determined spatial relationships and the determined fiducial mark positions so that the test probes are aligned with corresponding test pads, and an electrical test of the device is performed.

19 Claims, 19 Drawing Sheets

(51) Int. Cl.
*G01R 31/28* (2006.01)
*G01B 11/14* (2006.01)
*G01R 1/04* (2006.01)
*G01R 1/073* (2006.01)
*G06F 3/041* (2006.01)
*G06F 3/044* (2006.01)
*G06T 7/00* (2006.01)
*H05K 1/02* (2006.01)

(52) U.S. Cl.
CPC . *H05K 1/0268* (2013.01); *G06F 2203/04101* (2013.01); *G06F 2203/04111* (2013.01); *G06T 2207/10004* (2013.01)

(56) References Cited

U.S. PATENT DOCUMENTS

2004/0062104 A1* 4/2004 Muller ............... G01R 31/2891
                                              365/201
2010/0292947 A1   11/2010 Buk
2011/0089965 A1*  4/2011 Endres ................. G01R 35/00
                                              324/755.01

\* cited by examiner

ELECTRICAL TEST SYSTEM WITH VISION-GUIDED ALIGNMENT

CROSS-REFERENCE TO RELATED APPLICATIONS

Reference is made to commonly-assigned, co-pending U.S. patent application Ser. No. 14/509,298, entitled "Electrical test method with vision-guided alignment" by E. Zeise et al., published as U.S. 2016/0103176; to commonly-assigned, co-pending U.S. patent application Ser. No. 14/509,339, entitled "Vision-guided alignment system" by E. Zeise et al., published as U.S. 2016/0103177; and to commonly-assigned, co-pending U.S. patent application Ser. No. 14/509,370, entitled "Vision-guided alignment method" by E. Zeise et al., published as U.S. 2016/0103178, each of which is incorporated herein by reference.

FIELD OF THE INVENTION

This invention pertains to the field of roll-to-roll electrical testing, and more particularly to vision-guided alignment of test probes for contacting test pads of devices to be tested.

BACKGROUND OF THE INVENTION

Touch screens are visual displays with areas that may be configured to detect both the presence and location of a touch by, for example, a finger, a hand or a stylus. Touch screens may be found in televisions, computers, computer peripherals, mobile computing devices, automobiles, appliances and game consoles, as well as in other industrial, commercial and household applications. A capacitive touch screen includes a substantially transparent substrate which is provided with electrically conductive patterns that do not excessively impair the transparency—either because the conductors are made of a material, such as indium tin oxide, that is substantially transparent, or because the conductors are sufficiently narrow that the transparency is provided by the comparatively large open areas not containing conductors. For capacitive touch screens having metallic conductors, it is advantageous for the features to be highly conductive but also very narrow. Capacitive touch screen sensor films are an example of an article having very fine features with improved electrical conductivity resulting from an electroless plated metal layer.

Projected capacitive touch technology is a variant of capacitive touch technology. Projected capacitive touch screens are made up of a matrix of rows and columns of conductive material that form a grid. Voltage applied to this grid creates a uniform electrostatic field, which can be measured. When a conductive object, such as a finger, comes into contact, it distorts the local electrostatic field at that point. This is measurable as a change in capacitance. The capacitance can be measured at every intersection point on the grid. In this way, the system is able to accurately track touches. Projected capacitive touch screens can use either mutual capacitive sensors or self capacitive sensors. In mutual capacitive sensors, there is a capacitor at every intersection of each row and each column. A 16×14 array, for example, would have 224 independent capacitors. A voltage is applied to the rows or columns. Bringing a finger or conductive stylus close to the surface of the sensor changes the local electrostatic field which reduces the mutual capacitance. The capacitance change at every individual point on the grid can be measured to accurately determine the touch location by measuring the voltage in the other axis. Mutual capacitance allows multi-touch operation where multiple fingers, palms or styli can be accurately tracked at the same time.

WO 2013/063188 by Petcavich et al. discloses a method of manufacturing a capacitive touch sensor using a roll-to-roll process to print a conductor pattern on a flexible transparent dielectric substrate. A first conductor pattern is printed on a first side of the dielectric substrate using a first flexographic printing plate and is then cured. A second conductor pattern is printed on a second side of the dielectric substrate using a second flexographic printing plate and is then cured. The ink used to print the patterns includes a catalyst that acts as seed layer during subsequent electroless plating. The electrolessly plated material (e.g., copper) provides the low resistivity in the narrow lines of the grid needed for excellent performance of the capacitive touch sensor. Petcavich et al. indicate that the line width of the flexographically printed material can be 1 to 50 microns.

Flexography is a method of printing or pattern formation that is commonly used for high-volume printing runs. It is typically employed in a roll-to-roll format for printing on a variety of soft or easily deformed materials including, but not limited to, paper, paperboard stock, corrugated board, polymeric films, fabrics, metal foils, glass, glass-coated materials, flexible glass materials and laminates of multiple materials. Coarse surfaces and stretchable polymeric films are also economically printed using flexography.

Flexographic printing members are sometimes known as relief printing members, relief-containing printing plates, printing sleeves, or printing cylinders, and are provided with raised relief images onto which ink is applied for application to a printable material. While the raised relief images are inked, the recessed relief "floor" should remain free of ink.

Although flexographic printing has conventionally been used in the past for printing of images, more recent uses of flexographic printing have included functional printing of devices, such as touch screen sensor films, antennas, and other devices to be used in electronics or other industries. Such devices typically include electrically conductive patterns.

To improve the optical quality and reliability of the touch screen sensor film, it has been found to be preferable that the width of the grid lines be approximately 2 to 10 microns, and even more preferably to be 4 to 8 microns. In addition, in order to be compatible with the high-volume roll-to-roll manufacturing process, it is preferable for the roll of flexographically printed material to be electroless plated in a roll-to-roll electroless plating system.

After the touch screen sensor film has been printed and plated in roll-to-roll format, electrical testing is typically performed to eliminate defective touch screen sensor devices. For compatibility with high-volume roll-to-roll manufacturing processes, it is preferable to electrically test the touch screen sensor devices while they are still in roll format and prior to separation from the roll. This is particularly true if there are subsequent roll-to-roll processes such as application of protective liners or films.

The use of machine vision systems for aligning test probes with test pads of a device to be electrically tested is known. For example, U.S. Pat. No. 5,442,299 to Caggiano, entitled "Printed circuit board test fixture and method," and U.S. Pat. No. 5,321,351 to Swart et al., entitled "Test fixture alignment system," disclose test systems for printed circuit boards where alignment of the test probes is performed with reference to the sensed positions of fiducial marks formed on the printed circuit board.

With increased emphasis on device miniaturization it is desired to reduce the size and spacing of test pads, thereby requiring tighter alignment tolerances for the test probes. In addition, for roll-to-roll fabrication of devices on a flexible web of substrate, there can be distortion due to web tension or slippage during printing for example. The distortion can cause errors in the placement of the fiducial marks relative to the test pads. For a large area device or a large area set of devices being tested simultaneously, such placement errors of the fiducial marks can decrease the reliability of test probe alignment with the test pads, especially if the test pads are small and closely spaced. A test probe that misses its pad can result in the erroneous detection of an open circuit such that a false failure is recorded.

What is needed is a machine vision system that is capable of reliable alignment of test probes of an electrical test fixture to test pads of a device, even if there is distortion in the placement of fiducial marks relative to test pads.

Alignment of test probes for roll-to-roll electrical testing is an example of a more general problem for systems configured to perform an operation on an article, where the article includes a plurality of fiducial marks and a set of features of interest. The problem is that if fiducial marks are provided for determining the positions of the set of features, and if there is a variable placement error between the fiducial marks and the set of features, then the determination of the location of the fiducial marks alone can provide unreliable information regarding the positions of the set of features. The subsequently performed operation can sometimes miss its intended position when the variable placement error is sufficiently large. What is needed is a system that is capable of accurate determination of the positions of features of interest, even if there is uncertainty in the placement accuracy of fiducial marks associated with the features of interest.

SUMMARY OF THE INVENTION

The present invention represents an electrical testing system configured to test a series of devices fabricated on successive frames of a web of substrate, each frame including a plurality of fiducial marks and a device having a series of test pads, comprising:

a web transport system for advancing the web of substrate along a web transport path;

an electrical test fixture including a set of test probes adapted to make electrical contact with the test pads of a particular device on the web of substrate;

a test instrument associated with the set of test probes;

a digital imaging system configured to capture a digital image of at least a portion of a particular frame including the test pads of the particular device and the fiducial marks;

a fiducial sensing system including a plurality of fiducial sensors, each adapted to sense a position of an associated fiducial mark; and a controller configured to:
analyze a digital image captured by the digital imaging system to determine spatial relationships between positions of test pads and positions of the fiducial marks in the captured digital image;
determine positions of the fiducial marks using the fiducial sensing system;
adjust a position of the electrical test fixture responsive to the determined spatial relationships between positions of test pads and positions of the fiducial marks and the determined positions of the fiducial marks so that the test probes are aligned with corresponding test pads;
move the test probes into electrical contact with the test pads; and
perform an electrical test of the particular device using the test instrument.

This invention has the advantage that the test probes can be more accurately positioned relative to the test pads to compensate for any deviation of the test pads from their nominal positions, thereby improving the reliability of the electrical test.

It has the additional advantage that accurate alignment is possible even when there are variable placement errors between the fiducial marks and the set of test pads.

It has the further advantage that the accurate estimates of the positions of the test pads can be determined even when it is not practical to position a digital imaging system to capture images of the test pads when the device is positioned in proximity to the test instrument.

It has the still further advantage of providing a means for calibrating the digital imaging system.

BRIEF DESCRIPTION OF THE DRAWINGS

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1:
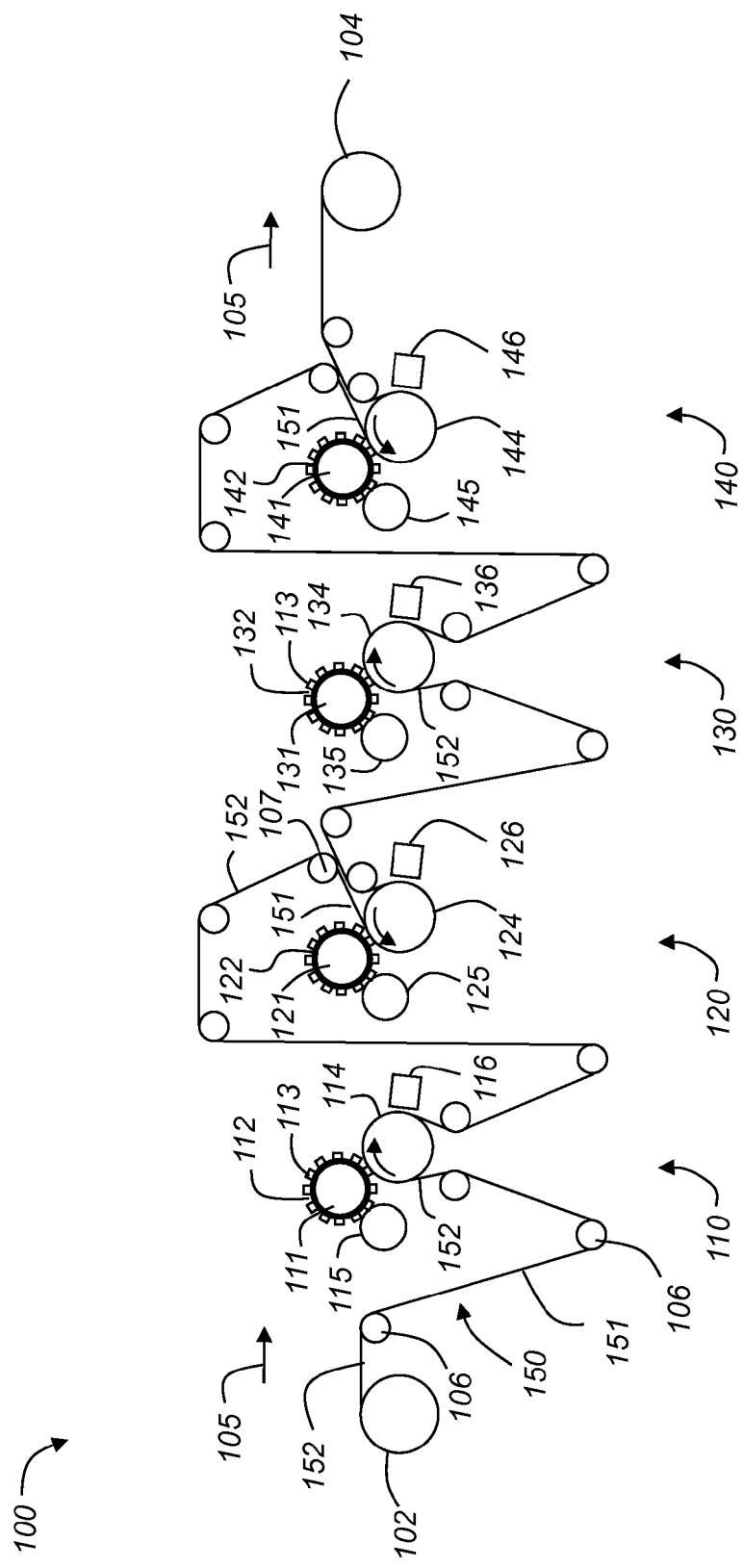
FIG. 1 is a schematic side view of a flexographic printing system for roll-to-roll printing on both sides of a substrate.

The present description will be directed in particular to elements forming part of, or cooperating more directly with, an apparatus in accordance with the present invention. It is to be understood that elements not specifically shown, labeled, or described can take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. It should be noted that, unless otherwise explicitly noted or required by context, the word "or" is used in this disclosure in a non-exclusive sense.

The example embodiments of the present invention are illustrated schematically and may not be to scale for the sake of clarity. One of ordinary skill in the art will be able to readily determine the specific size and interconnections of the elements of the example embodiments of the present invention.

References to upstream and downstream herein refer to direction of flow. Web media moves along a web transport path in a web advance direction from upstream to downstream.

As described herein, exemplary embodiments of the present invention provide a vision-guided roll-to-roll electrical testing system and method where an electrical test fixture is aligned to test pads formed on a web of substrate using a digital imaging system for capturing a digital image of at least the test pads of a particular device plus associated fiducial marks, and using a separate fiducial sensing system for sensing positions of the associated fiducial marks. Broader applications of position determination of features using a digital imaging system plus a separate fiducial sensing system are also contemplated as described below. Within the context of the present invention, the term "vision-guided" refers to the use of a digital imaging system (i.e., a computer vision system) to guide the alignment of an instrument (e.g., an electrical test fixture) with an object (e.g., an electrical device).

A context for roll-to-roll electrical testing will be provided relative to flexographically printed touch sensor films for touch screens. FIG. 1 is a schematic side view of a flexographic printing system 100 that can be used in embodiments of the invention for roll-to-roll printing of touch sensor films on both sides of a substrate 150. Substrate 150 is fed as a web from supply roll 102 to take-up roll 104 through flexographic printing system 100. Substrate 150 has a first side 151 and a second side 152. Optionally, the printed features can subsequently be electroless plated for improved electrical conductivity The flexographic printing system 100 includes two print modules 120 and 140 that are configured to print on the first side 151 of substrate 150, as well as two print modules 110 and 130 that are configured to print on the second side 152 of substrate 150. The web of substrate 150 travels overall in roll-to-roll direction 105 (left to right in the example of FIG. 1). However, various rollers 106 and 107 are used to locally change the direction of the web of substrate as needed for adjusting web tension, providing a buffer, and reversing the substrate 150 for printing on an opposite side. In particular, note that in print module 120 roller 107 serves to reverse the local direction of the web of substrate 150 so that it is moving substantially in a right-to-left direction.

Each of the print modules 110, 120, 130, 140 includes some similar components including a respective plate cylinder 111, 121, 131, 141, on which is mounted a respective flexographic printing plate 112, 122, 132, 142, respectively. Each flexographic printing plate 112, 122, 132, 142 has raised features 113 defining an image pattern to be printed on the substrate 150. Each print module 110, 120, 130, 140 also includes a respective impression cylinder 114, 124, 134, 144 that is configured to force a side of the substrate 150 into contact with the corresponding flexographic printing plate 112, 122, 132, 142. Impression cylinders 124 and 144 of print modules 120 and 140 (for printing on first side 151 of substrate 150) rotate counter-clockwise in the view shown in FIG. 1, while impression cylinders 114 and 134 of print modules 110 and 130 (for printing on second side 152 of substrate 150) rotate clockwise in this view.

Each print module 110, 120, 130, 140 also includes a respective anilox roller 115, 125, 135, 145 for providing ink to the corresponding flexographic printing plate 112, 122, 132, 142. As is well known in the printing industry, an anilox roller is a hard cylinder, usually constructed of a steel or aluminum core, having an outer surface containing millions of very fine dimples, known as cells. Ink is provided to the anilox roller by a tray or chambered reservoir (not shown). In some embodiments, some or all of the print modules 110, 120, 130, 140 also include respective UV curing stations 116, 126, 136, 146 for curing the printed ink on substrate 150.

Figure 2:
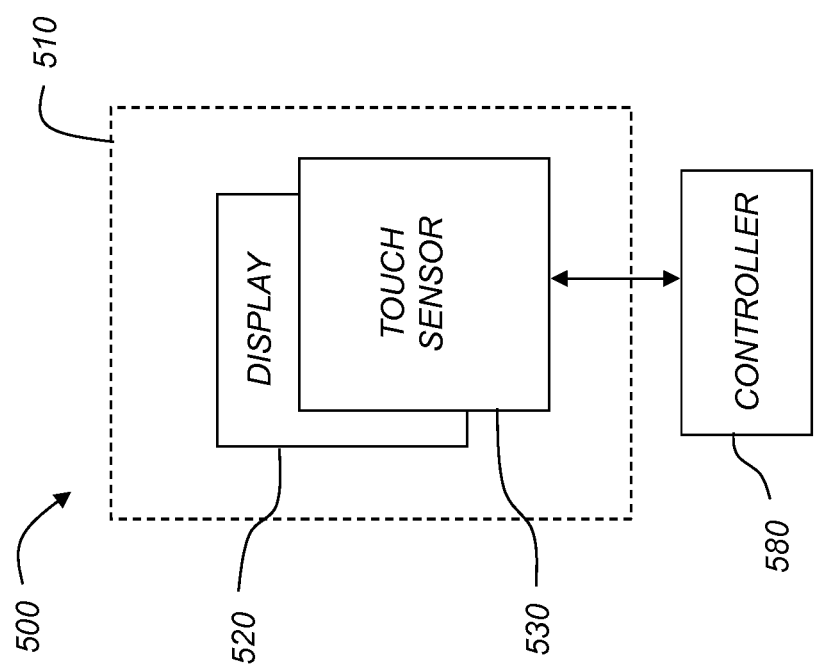
FIG. 2 is a high-level system diagram for an apparatus having a touch screen with a touch sensor that can be printed using embodiments of the invention.

FIG. 2 shows a high-level system diagram for an apparatus 500 having a touch screen 510 including a display device 520 and a touch sensor 530 that overlays at least a portion of a viewable area of display device 520. Touch sensor 530 senses touch and conveys electrical signals (related to capacitance values for example) corresponding to the sensed touch to a touch screen controller 580. Touch sensor 530 is an example of an article that can be tested using a roll-to-roll electrical test system described below.

Figure 3:
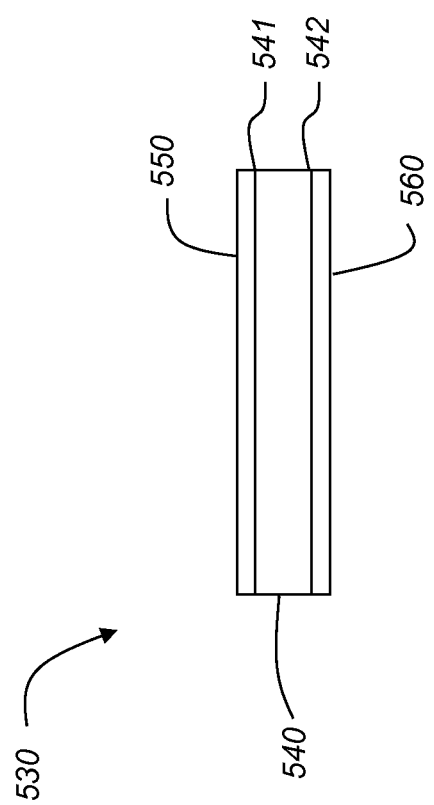
FIG. 3 is a side view of the touch sensor of FIG. 2.

FIG. 3 shows a schematic side view of a touch sensor 530. Transparent substrate 540, for example polyethylene terephthalate, has a first conductive pattern 550 formed on a first side 541, and a second conductive pattern 560 formed on a second side 542.

Figure 4:
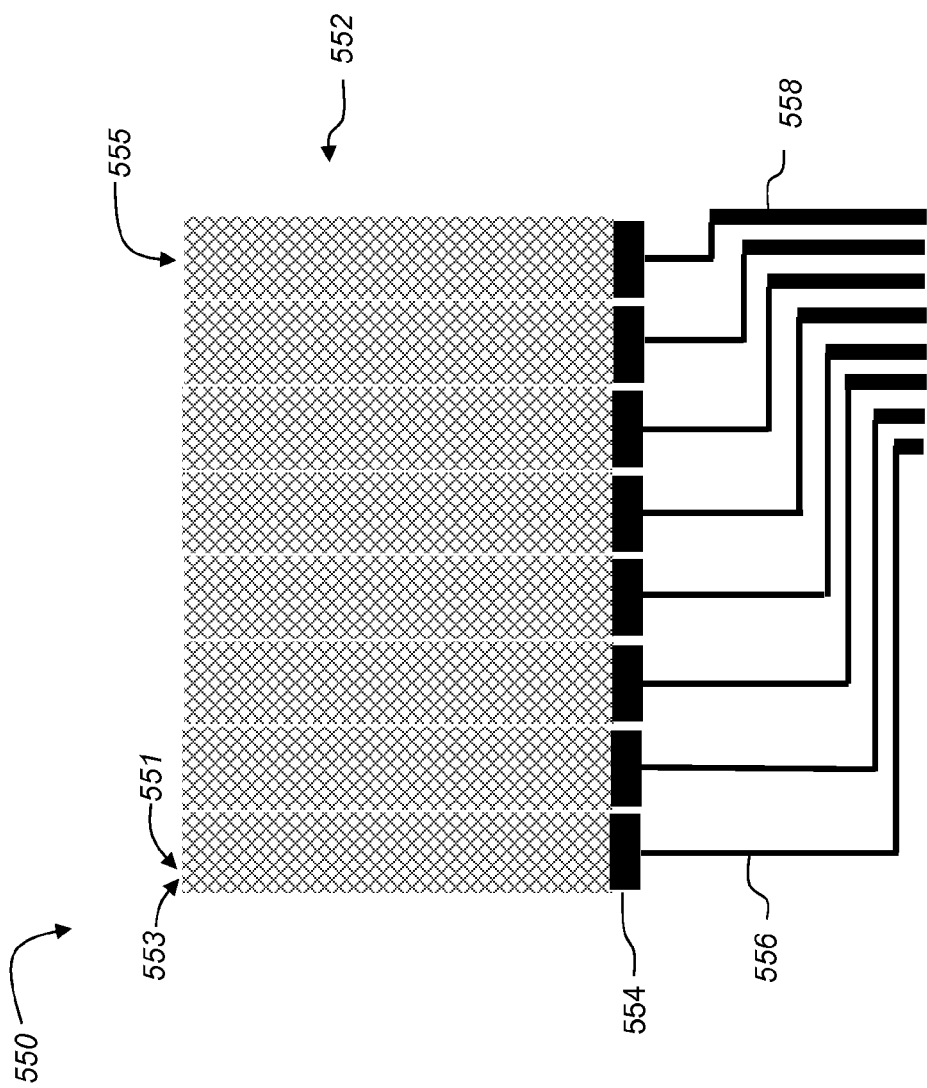
FIG. 4 is a top view of a conductive pattern printed on a first side of the touch sensor of FIG. 3.

FIG. 4 shows an example of a conductive pattern 550 that can be printed on first side 541 (FIG. 3) of substrate 540 (FIG. 3) using one or more print modules such as print modules 120 and 140 (FIG. 1) of flexographic printing system 100 (FIG. 1) as described above. Conductive pattern 550 includes a grid 552 including grid columns 555 of intersecting fine lines 551 and 553 that are connected to an array of channel pads 554. Interconnect lines 556 connect the channel pads 554 to the connector pads 558 that are connected to touch screen controller 580 (FIG. 2). Conductive pattern 550 can be printed by a single print module 120 in some embodiments. However, because the optimal print conditions for fine lines 551 and 553 (e.g., having line widths on the order of 4 to 8 microns) are typically different than for printing the wider channel pads 554, connector pads 558 and interconnect lines 556, it can be advantageous to use one print module 120 for printing the fine lines 551 and 553 and a second print module 140 for printing the wider features. Furthermore, for clean intersections of fine lines 551 and 553, it can be further advantageous to print and cure one set of fine lines 551 using one print module 120, and to print and cure the second set of fine lines 553 using a second print module 140, and to print the wider features using a third print module (not shown in FIG. 1) configured similarly to print modules 120 and 140.

Figure 5:
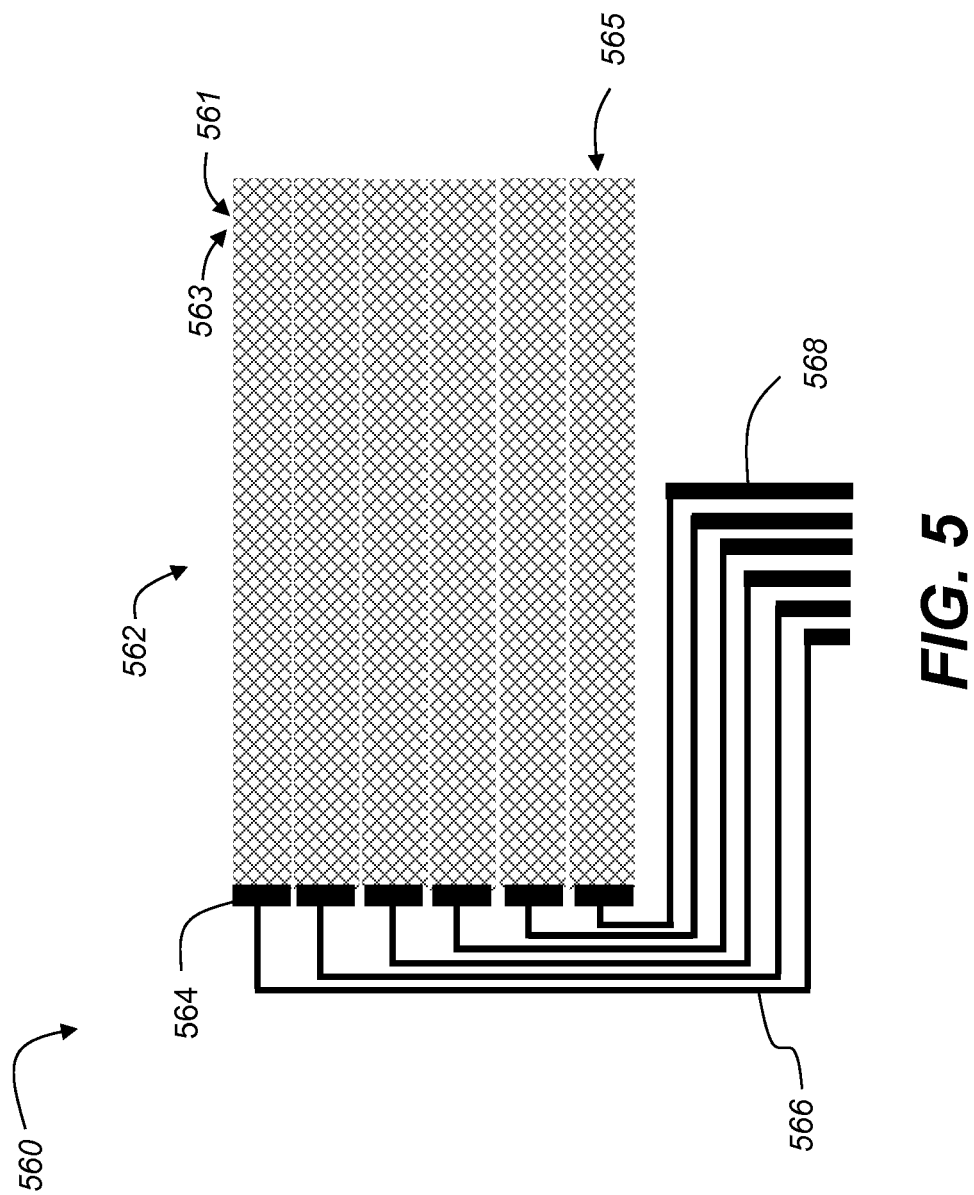
FIG. 5 is a top view of a conductive pattern printed on a second side of the touch sensor of FIG. 3.

FIG. 5 shows an example of a conductive pattern 560 that can be printed on second side 542 (FIG. 3) of substrate 540 (FIG. 3) using one or more print modules such as print modules 110 and 130 (FIG. 1) of flexographic printing system 100 (FIG. 1) as described above. Conductive pattern 560 includes a grid 562 including grid rows 565 of intersecting fine lines 561 and 563 that are connected to an array of channel pads 564. Interconnect lines 566 connect the channel pads 564 to the connector pads 568 that are connected to touch screen controller 580 (FIG. 2). In some embodiments, conductive pattern 560 can be printed by a single print module 110. However, because the optimal print conditions for fine lines 561 and 563 (e.g., having line widths on the order of 4 to 8 microns) are typically different than for the wider channel pads 564, connector pads 568 and interconnect lines 566, it can be advantageous to use one print module 110 for printing the fine lines 561 and 563 and a second print module 130 for printing the wider features. Furthermore, for clean intersections of fine lines 561 and 563, it can be further advantageous to print and cure one set of fine lines 561 using one print module 110, and to print and cure the second set of fine lines 563 using a second print module 130, and to print the wider features using a third print module (not shown in FIG. 1) configured similarly to print modules 110 and 130.

Alternatively, in some embodiments conductive pattern 550 can be printed using one or more print modules configured like print modules 110 and 130, and conductive pattern 560 can be printed using one or more print modules configured like print modules 120 and 140 of FIG. 1.

With reference to FIGS. 2-5, in operation of touch screen 510, touch screen controller 580 can sequentially electrically drive grid columns 555 via connector pads 558 and can sequentially sense electrical signals on grid rows 565 via connector pads 568. In other embodiments, the driving and sensing roles of the grid columns 555 and the grid rows 565 can be reversed.

Figure 6:
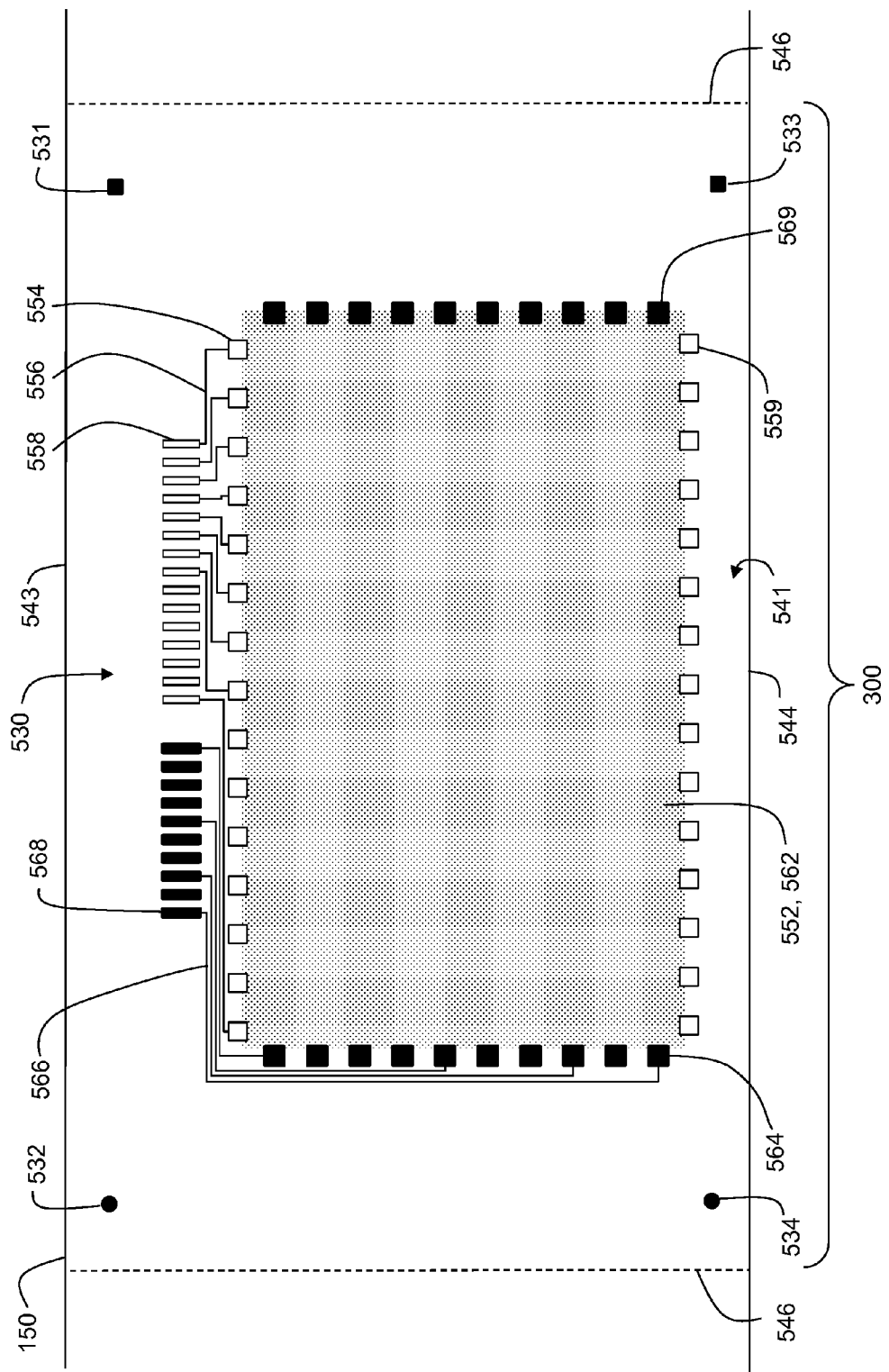
FIG. 6 is a top view of a touch sensor formed on a transparent web of substrate.

FIG. 6 is a top view of a touch sensor 530 formed on a transparent web of substrate 150 together with fiducial marks 531 and 532 near a first edge 543 and fiducial marks 533 and 534 near a second edge 544. Fiducial marks 531, 532, 533 and 534 are formed at predetermined target positions relative to a target position of the associated touch sensor 530. Grid 552 (FIG. 4) formed on first side 541 and grid 562 (FIG. 5) formed on second side 542 (FIG. 3) are represented together as a shaded region in FIG. 6. On first side 541, connector pads 558 are connected to column channel pads 554 by interconnect lines 556 and are connected to probe pads 559 through grid 552. On second side 542, connector pads 568 are connected to row channel pads 564 by interconnect lines 566 and are connected to probe pads 569 through grid 562. (For clarity, only a subset of the interconnect lines 556 and 566 are shown.) In some embodiments some of the fiducial marks such as fiducial marks 531 and 532 are formed on the first side 541 of the substrate 150 and other fiducial marks such as fiducial marks 533 and 534 are formed on the second side 542 (FIG. 3) of the substrate 150.

Figure 7:
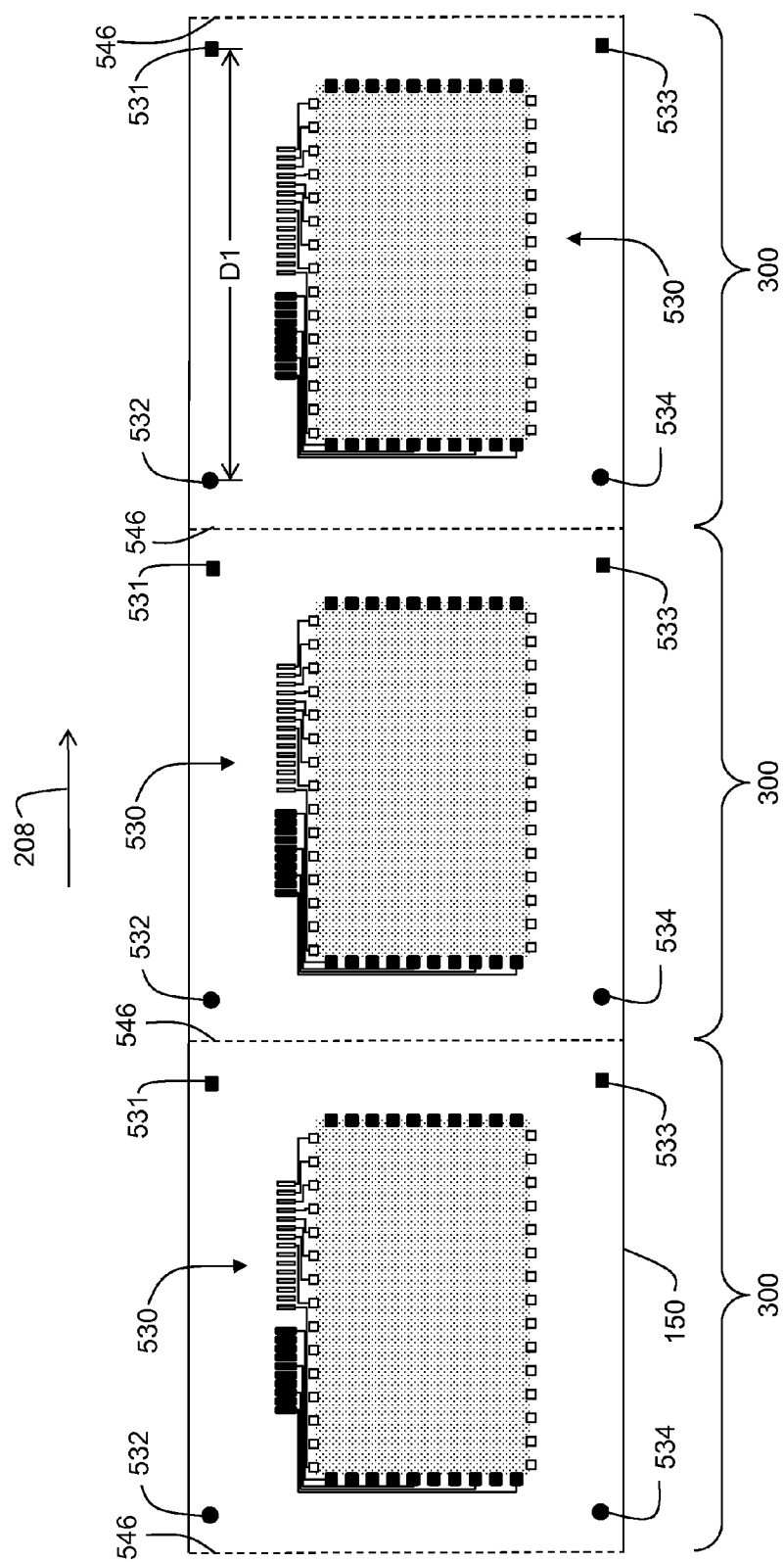
FIG. 7 is a lower magnification top view of the web of substrate of FIG. 6 showing three successive frames of touch sensors.

Touch sensor 530 and fiducial marks 531, 532, 533 and 534 are formed within a frame 300 of substrate 150 defined between two frame boundaries 546, as well as first and second edges 543, 544. FIG. 7 is similar to FIG. 6 but shows a lower magnification top view of web of substrate 150 so that three successive frames 300 separated by frame boundaries 546 are shown. Each frame 300 includes a touch sensor 530 and the associated fiducial marks 531, 532, 533 and 534. In the example shown in FIG. 7, fiducial marks 531 and 532 are formed such that their center-to-center positions are a spacing D1 apart.

Returning to a discussion of FIG. 6, in order to determine whether a particular touch sensor 530 has any electrical defects an electrical test is performed to test continuity or resistance between connector pads 558 and corresponding probe pads 559 on first side 541 of substrate 150 and between connector pads 568 and corresponding probe pads 569 on second side 542 (FIG. 3) of substrate 150, looking for electrical shorts and opens. Herein the term "test pads" will be used generically to include connector pads 558, 568 as well as probe pads 559, 569.

Figure 8:
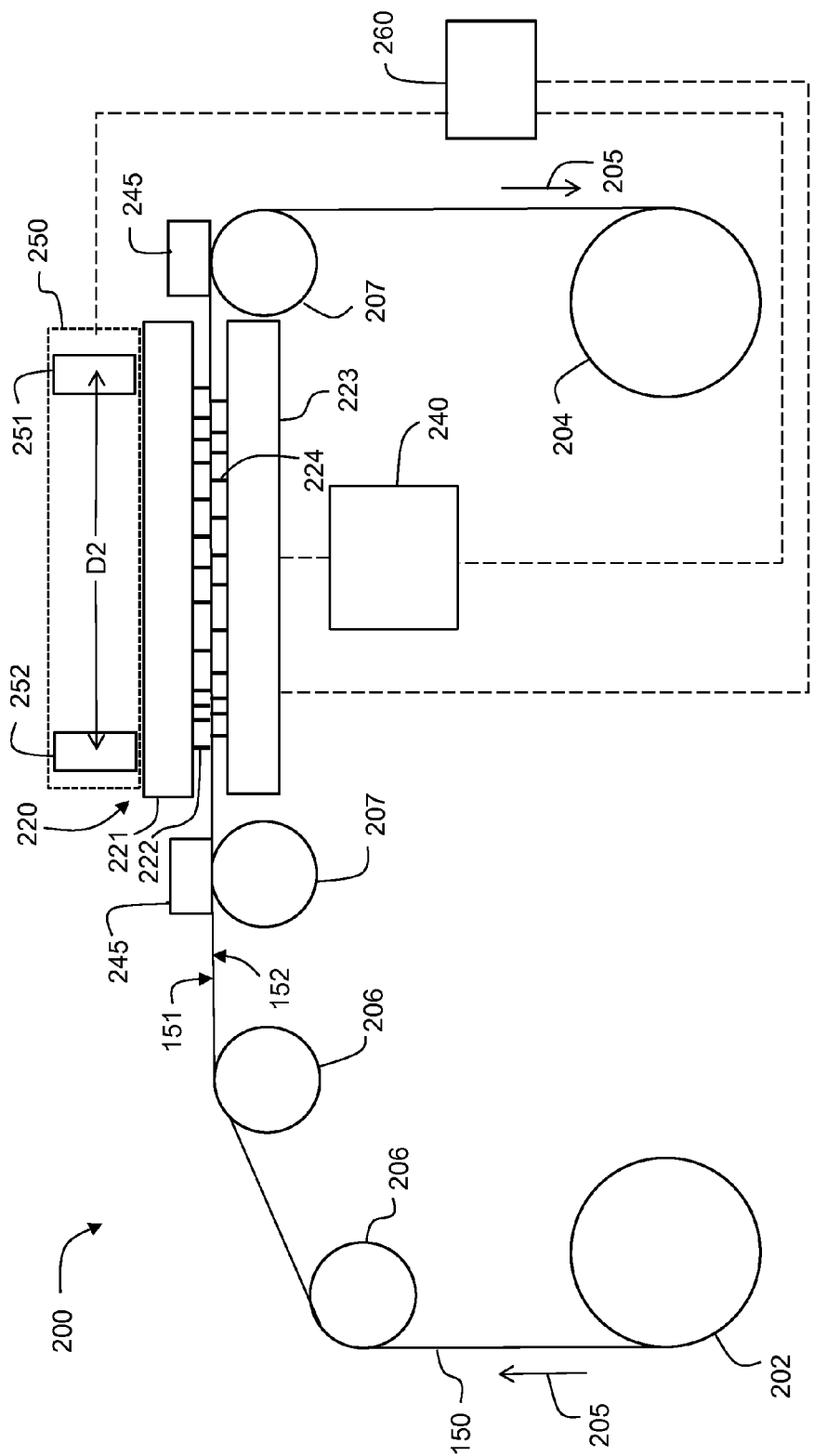
FIG. 8 is a schematic side view of an exemplary roll-to-roll electrical test system.

FIG. 8 shows a schematic side view of a basic roll-to-roll electrical test system 200. Web of substrate 150 is guided by rollers 206 and 207 from a supply roll 202 to a take-up roll 204 along a web transport path 205. Rollers 206 and 207 are part of a web transport system, which also includes at least one motor (not shown) to advance the web of substrate 150 with an appropriate amount of tension. Web of substrate 150 is guided to electrical test fixture 220 having an upper test bed 221 having upper test probes 222 for contacting a first set of test pads (connector pads 558 and probe pads 559) on the first side 151 of web 150 and a lower test bed 223 with lower test probes 224 for contacting a second set test pads (connector pads 568 and probe pads 569) on the second side 152 of web 150. As described below, electrical test fixture 220 is movable so that its position and orientation can be adjusted to bring the test probes 222 and 224 into aligned contact with the connector pads 558, 568 and probe pads 559, 569.

A closed position of electrical test fixture 220 for performing the electrical test using test instrument 240 is shown in FIG. 8 where the upper test probes 222 and lower test probes 224 are positioned in contact with the respective test pads. Electrical test fixture 220 also has an open position (not shown) where the upper test probes 222 and lower test probes 224 are withdrawn from contacting the test pads for allowing web of substrate 150 to be advanced for testing the touch sensor 530 (FIG. 7) in the next frame 300 (FIG. 7). Electrical test fixture 220 can be opened, for example by vertically moving the upper test bed 221 and the lower test bed 223 away from the web of substrate 150, or by pivoting one or both of the upper test bed 221 and the lower test bed 223 about a hinge to open like a clamshell.

When web of substrate 150 has been advanced such that frame 300 is located at electrical test fixture 220, clamps 245 on either side of electrical test fixture 220 fix the web of substrate 150 in a stopped position, where the web of substrate is clamped against rollers 207. In the example shown in FIG. 8, a fiducial sensing system 250, including a first fiducial sensor 251 and a second fiducial sensor 252, is provided for viewing the web of substrate 150 at the approximate positions of fiducial marks 531, 532 (FIG. 9) in the frame 300 that is positioned at the electrical test fixture 220. First fiducial sensor 251 and second fiducial sensor 252 can include a photodiode, a photodiode array, a CMOS sensor, a charge coupled device, a digital camera, or any other type of sensing device known in the art that can sense the fiducial marks 531, 532. First fiducial sensor 251 and second fiducial sensor 252 have a center-to-center spacing D2, which is nominally the same as the target spacing D1 between the fiducial marks 531 and 532 in FIG. 7. (While the spacing D1 between fiducial marks 531 and 532 is ideally equal to D2, manufacturing tolerances can cause D1 to vary somewhat.)

A controller 260 determines the positions of the fiducial marks 531, 532 using fiducial sensing system 250. Based on the known target spatial relationships between the touch sensor 530 and the fiducial marks 531, 532, the controller 260 adjusts a position of the electrical test fixture 220 such that the test probes 222 should be aligned with the corresponding test pads (connector pads 558 and probe pads 559) on the first side 151, and the test probes 224 should be aligned with the corresponding test pads (connector pads 568 and probe pads 569) on the second side 152.

Figure 9:
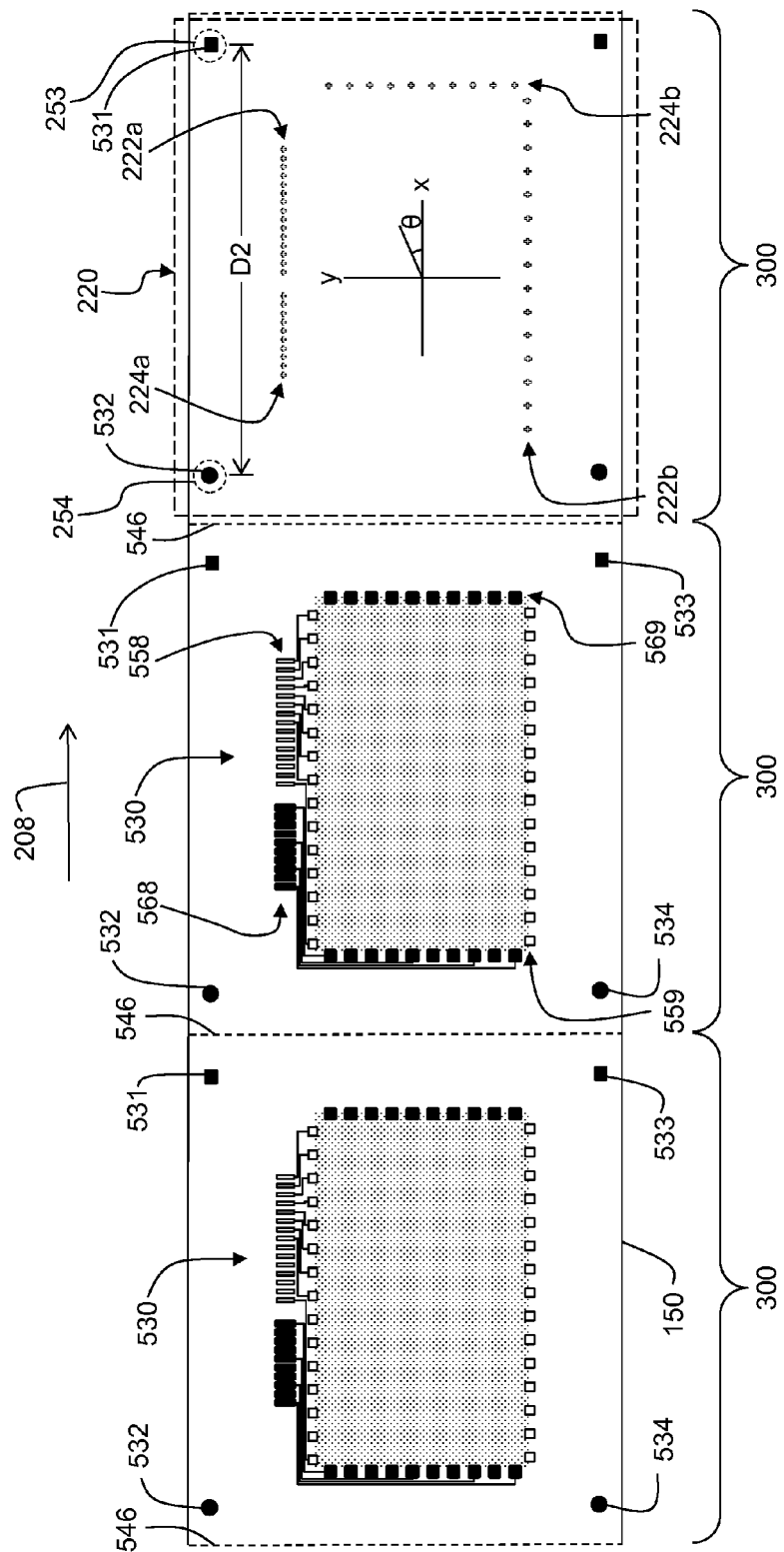
FIG. 9 is similar to the top view of FIG. 7, but also shows the position of the electrical test fixture relative to the web of substrate.

With reference to FIG. 9, adjustment of a position of the electrical test fixture 220 (FIG. 8) can include translating the electrical test fixture 220 within an x-y plane parallel to a surface of the web of substrate 150. Adjustment of the position of the electrical test fixture 220 can also include rotating the electrical test fixture 220 by an angle θ about an axis that is perpendicular to a surface of the web of substrate 150. The electrical test fixture 220 is then closed to bring the test probes 222, 224 into contact with the web of substrate 150, and the controller causes an electrical test of the particular device to be performed using a test instrument 240.

FIG. 9 is similar to the top view of FIG. 7, but instead of showing the touch sensor 530 in the rightmost frame 300, the positions of upper test probes 222a, 222b and lower test probes 224a, 224b of electrical test fixture 220 are shown in order to illustrate the probe configuration relative to the positions of connector pads 558, 568 and probe pads 559, 569 that are shown for the touch sensor 530 in the center frame 300. Upper test probes 222a correspond to connector pads 558 and upper test probes 222b correspond to probe pads 559 on first side 151 (FIG. 8) of web of substrate 150. Lower test probes 224a correspond to connector pads 568 and lower test probes 224b correspond to probe pads 569 on second side 152 (FIG. 8) of web of substrate 150. In FIG. 9, web of substrate 150 has been advanced along media advance direction 208 until the rightmost frame 300 of FIG. 7 is located at electrical test fixture 220.

Also shown in the rightmost frame in FIG. 9 is a first field-of-view 253 associated with first fiducial sensor 251 (FIG. 8) and a second field-of-view 254 associated with second fiducial sensor 252 (FIG. 8). Note that the fields-of-view 253, 254 of the fiducial sensors 251, 252 are typically larger than the fiducial marks 531, 532. In general, the fields-of-view 253, 254 of the fiducial sensors 251, 252 should be larger than an expected variability in the position of the corresponding fiducial marks 531, 532. This enables the detection of the fiducial marks 531, 532 as their position varies. Part of the variability in the position can result from positioning tolerances of the web of substrate 150 relative to electrical test fixture 220 as the web of substrate 150 is advanced and then stopped and clamped. Another part of the variability in the position can result from fabrication tolerances during formation of the fiducial marks 531, 532, for example due to web stretching or slipping. Depending upon fiducial geometry and sensor configuration, in some embodiments (not shown) the fields-of-view 253, 254 need not be larger than entire corresponding fiducial mark. For example, for a fiducial mark having a cross-hair shape, the critical positioning information is contained at the position where the two arms of the cross-hair intersect, not at the extreme ends of the arms.

Satisfactory operation of the exemplary roll-to-roll electrical test system 200 shown in FIG. 8 depends upon there being sufficiently small fabrication errors in relative positions between the fiducial marks 531, 532 and the test pads (connector pads 558, 568 and probe pads 559, 569) within a given frame 300. As shown in FIG. 9, the fields-of-view 253 and 254 are far smaller than the entire frame 300. The positions of the test pads (connector pads 558, 568 and probe pads 559, 569) are estimated based on the ideal spatial relationships between the test pads and the fiducial marks, 531, 532, as well as the actual positions of the fiducial marks 531, 532 as measured by the fiducial sensors 251, 252, respectively. While the fiducial sensing system 250 (FIG. 8) can determine actual positions of fiducial marks 531, 532 with a high degree of accuracy, fabrication-related distortion can produce errors in the estimated positions of the connector pads 558, 568 and probe pads 559, 569. This can be especially problematic where the connector pads 558, 568 or probe pads 559, 569 are small and spaced closely together, or if the connector pads 558, 568 or probe pads 559, 569 are located relatively far from the fiducial marks 531, 532. In such situations the test probes 222a, 222b, 224a, 224b can be sufficiently misaligned such that false "electrical opens" can be detected because a particular test probe misses a corresponding test pad, or false "electrical shorts" can be detected because a particular test probe bridges between two adjacent test pads.

Figure 10:
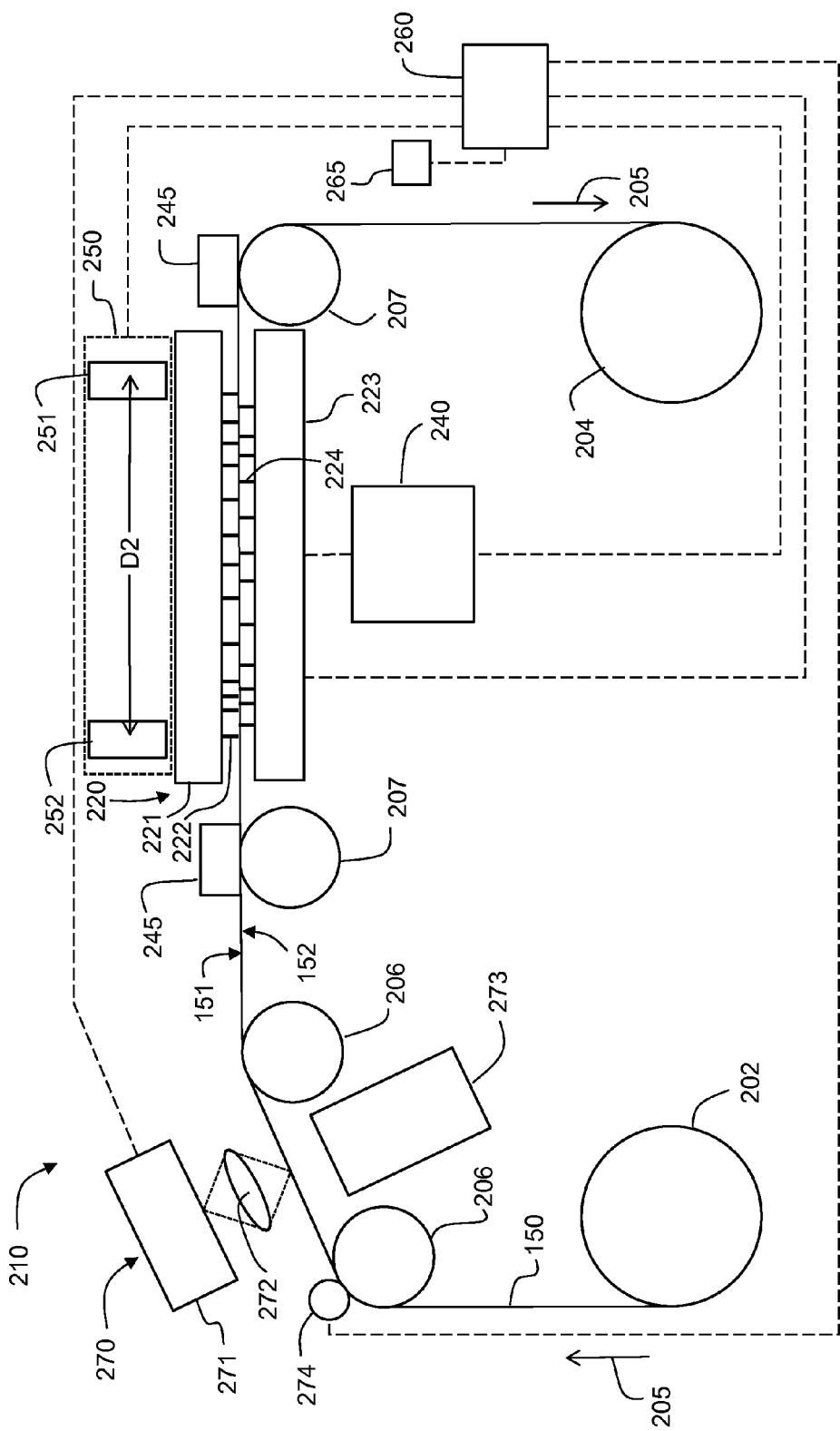
FIG. 10 is a schematic side view of a roll-to-roll electrical test system according to an embodiment of the invention.
Figure 11:
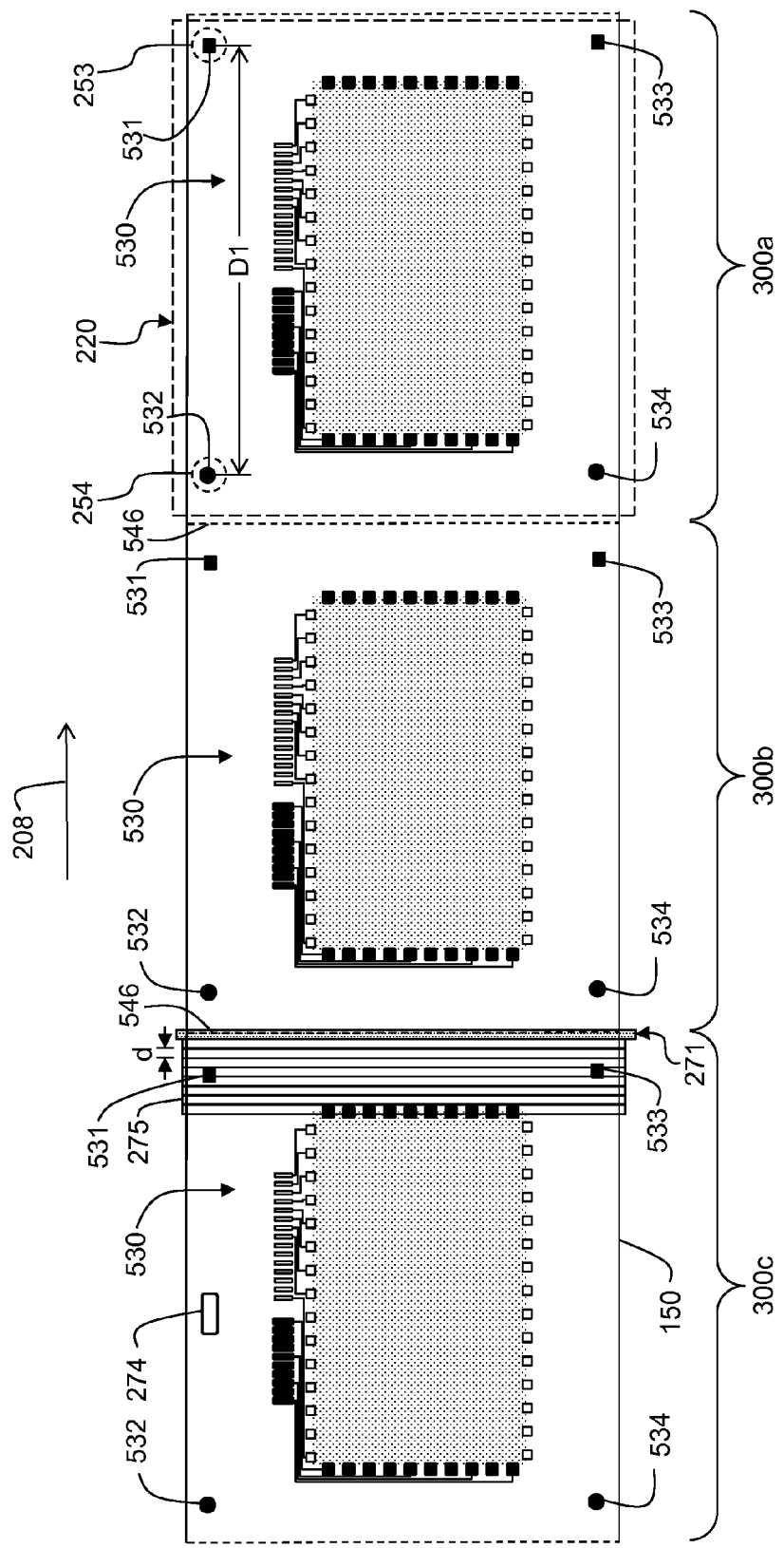
FIG. 11 is similar to the top view of FIG. 7, but also shows the capture of image lines by a line-scan camera.

FIG. 10 shows a schematic side view of an exemplary improved roll-to-roll electrical test system 210 according to an embodiment of the invention. The primary difference between the improved roll-to-roll electrical test system 210 and basic roll-to-roll electrical test system 200 (FIG. 8) is the incorporation of a digital imaging system 270 in the electrical test system 210 for capturing a digital image of at least a portion of the frame 300 (FIG. 7) that includes the test pads (i.e., connector pads 558, 568 and probe pads 559, 569) for the touch sensor 530, as well as the associated fiducial marks 531, 532. In the example shown in FIG. 10, the digital imaging system 270 includes a line-scan camera 271, a lens 272, a light source 273, and a surface encoder 274. Line-scan camera 271 includes a one-dimensional array of photo sensors (not shown) that are spaced apart at precise intervals along a direction that is perpendicular to media advance direction 208 (FIG. 11). Light from light source 273 is transmitted through web of substrate 150 so that features on both first side 151 and second side 152 are imaged through lens 272 and captured by line-scan camera 271. Surface encoder 274 is in contact with a surface of the web of substrate 150 so that a distance that the web of substrate 150 has been advanced can be measured.

As illustrated in FIG. 11, when the surface encoder 274 indicates that the web of substrate 150 has been advanced in the media advance direction 208 by a distance d that is nominally equal to the line width of a single image line 275, the line-scan camera 271 (FIG. 10) is controlled to capture the next image line 275. In particular, the surface encoder 274 provides an encoder signal representing a position of the web of substrate 150, and a timing for capturing successive image lines 275 is determined responsive to the encoder signal as the web of substrate 150 moves past the line-scan camera 271. In this way the line-scan camera 271 of the digital imaging system 270 (FIG. 10) captures a set of successive image lines as the web of substrate 150 is moved along the web transport path 205 (FIG. 10). The set of successive image lines 275 is combined by controller 260 to provide a composite digital image that includes the test pads (connector pads 558, 568 and probe pads 559, 569) as well as the associated fiducial marks 531, 532. A problem that can occur is that due to slippage of surface encoder 274 or build-up of particulate contaminants on surface encoder 274, there can be errors in measuring the media advance distance, and the capture of successive line images 275 by line-scan camera 271 can be therefore triggered at wrong intervals. Because of this, distortion (such as stretching or shrinkage along the media advance direction 208) can be introduced into the composite digital image analyzed by controller 260 such that spatial relationships determined between positions of test pads (connector pads 558, 568 and probe pads 559, 569) and positions of the fiducial marks 531, 532 may become inaccurate. Therefore, it can be beneficial to provide a method to calibrate the encoder signal from the surface encoder 274, as will be discussed in more detail later.

In the example of electrical test system 210 described above with reference to FIG. 10, there is a first sensing system (fiducial sensing system 250) that is capable of determining the positions of the fiducial marks 531, 532 with a high level of accuracy, but does not provide direct information about the actual positions of the test pads (connector pads 558, 568 and probe pads 559, 569); and a second sensing system (digital imaging system 270) that is capable of providing composite image that includes the fiducial marks 531, 532 as well as the test pads (connector pads 558, 568 and probe pads 559, 569), but is susceptible to image distortion, especially along the media advance direction 208. Typically, the fiducial sensing system 250 is located along the web transport path 205 downstream of the digital imaging system 270 and includes a plurality of fiducial sensors 251, 252 having associated fields-of-view 253, 254 (FIG. 11) which are much smaller than the field-of-view associated with the digital imaging system 270. In some embodiments of the invention, the fiducial mark positions determined by the fiducial sensing system 250 are used together with the digital image provided by the digital imaging system 270 to determine more accurate estimates of the test pad positions and make appropriate adjustments in the position of the electrical test fixture 220. In such embodiments, the very accurate distance measurements provided by the fiducial sensing system 250 can be used to compensate for geometric distortion within the composite digital image and thereby to calibrate the digital imaging system 270.

Figure 12:
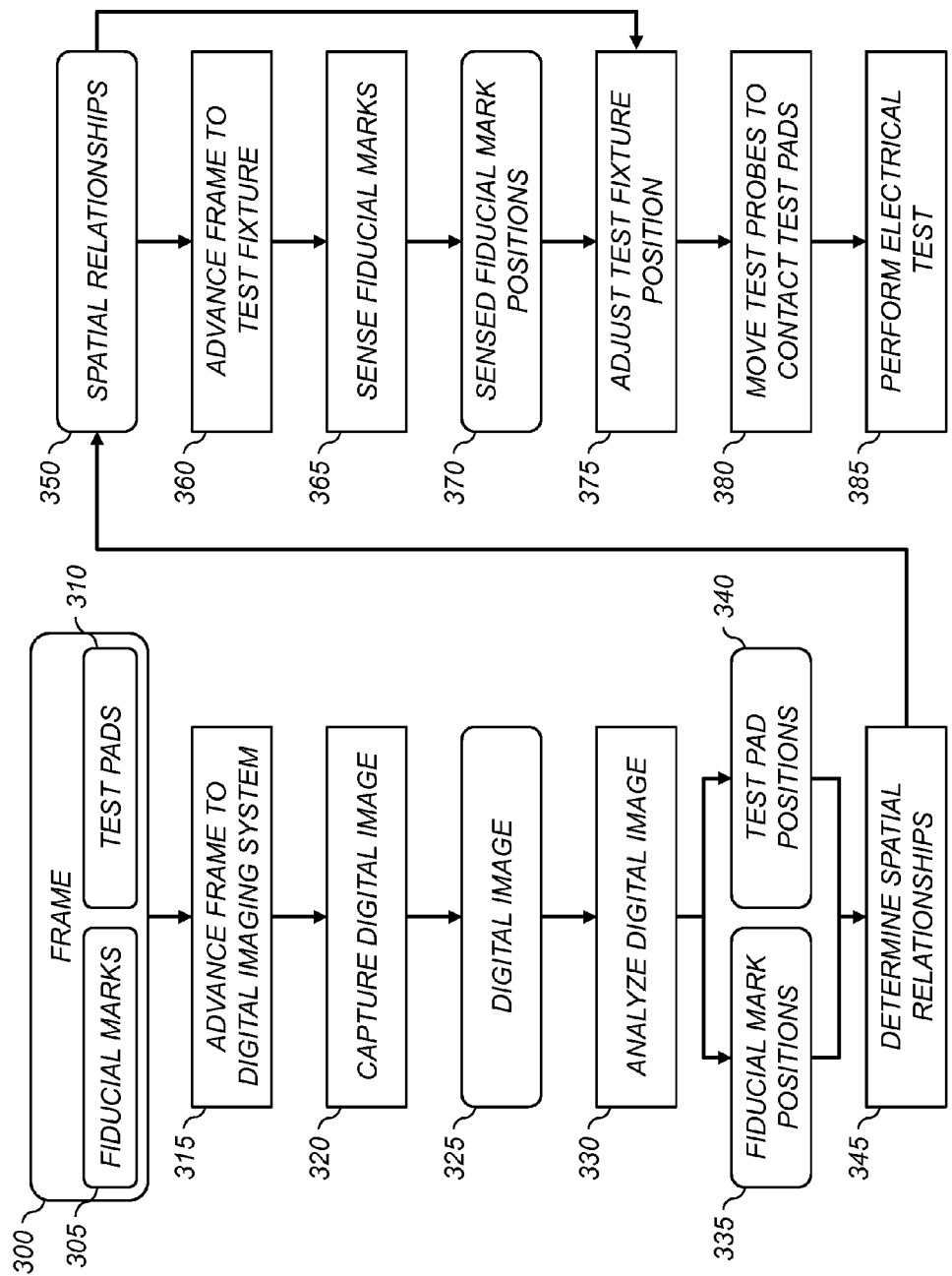
FIG. 12 is a flow diagram for a method of electrically testing devices according to an embodiment of the invention.

FIG. 12 shows a flowchart of a method for using the improved roll-to-roll electrical test system 210 of FIG. 10 to electrically test devices fabricated on successive frames 300 on a web of substrate 150. Each frame 300 includes an associated plurality of fiducial marks 305 (e.g., fiducial marks 531, 532) and an associated electrical device (e.g., touch sensor 530) having a series of test pads 310 (e.g., connector pads 558, 568 and probe pads 559, 569). In a preferred embodiment, some or all of the steps of the method are performed by using the controller 260 to control the appropriate components of the electrical test system 210 and to perform associated analysis operations.

In advance frame to digital imaging system step 315, the web of substrate 150 is advanced along the web transport path 205 until a particular frame 300 is proximate to the digital imaging system 270. A capture digital image step 320 is used to capture a digital image 325 using the digital imaging system 270. The digital image 325 includes at least a portion of the particular frame 300 that includes the associated fiducial marks 305 and the test pads 310 of the associated device.

An analyze digital image step 330 is then used to automatically analyze the captured digital image 325 using controller 260 to determine fiducial mark positions 335 and test pad positions 340 within the captured digital image 325. The fiducial mark positions 335 and the test pad positions 340 can be determined and represented using any method known in the art. In exemplary embodiments, the fiducial mark positions 335 and the test pad positions 340 are determined by detecting the corresponding fiducial marks 305 and the test pads 310 using any appropriate feature detection method. In an exemplary embodiment, centroids of the detected fiducial marks 305 and the test pads 310 are then computed, and the x-y pixel positions of the centroids within the digital image 325 are used to represent the corresponding fiducial mark positions 335 and the test pad positions 340. Methods for analyzing a digital image to detect fiducial marks 305 and the test pads 310 and methods for computing corresponding centroids will be well-known to those skilled in the art and any such method can be used in accordance with the present invention. It should be noted that computing centroids represent one example of identifying a position of a feature, but any other appropriate means for identifying positions of the detected fiducial marks 305 and test pads 310 can alternatively be used in accordance with the present.

A determine spatial relationships step 345 is then used to determine spatial relationships 350 between the determined test pad positions 340 of the test pads 310 and the determined fiducial mark positions 335 of the fiducial marks 305 in the captured digital image 325. The spatial relationships 350 can be represented using any appropriate method known in the art. In an exemplary embodiment, the fiducial mark positions 335 are used to define a coordinate system. For example, if there are two fiducial marks 305, a first axis can be defined that passes through the determined fiducial mark positions 335, and a second axis can be defined which is orthogonal to the first axis and passes through one of the fiducial mark positions 335. If there are more than two fiducial marks, then a fitting process can be used to define the coordinate system that represents the best fit to the determined fiducial mark positions 335. The coordinates of the test pad positions 340 in the coordinate system can then be determined and used as a representation of the spatial relationships 350. In various embodiments, the coordinates can be expressed in various units such as pixel coordinates or physical coordinates (e.g., millimeters). In some embodiments, a relative coordinate system can be defined which is normalized by the distance between two of the fiducial mark positions 335. In another exemplary embodiments, the spatial relationships 350 of the test pad positions 340 relative to the fiducial mark positions 335 can be represented by offset distances (e.g., $\Delta x$ and $\Delta y$) between the test pad positions 340 and one or more of the fiducial mark positions.

In some cases, the optical system associated with the digital imaging system 270 (FIG. 10) may introduce certain geometrical distortions (e.g., "pincushion distortion" or "barrel distortion") into the captured digital image 325. Furthermore, when the digital imaging system 270 is a line-scan camera 271, any errors in the timing of successive image lines 275 due to calibration errors for the surface encoder (e.g., due to particulates on the surface encoder 274 or slippage of the surface encoder 274) can introduce additional geometric distortions. In some embodiments, any geometric distortions introduced by the digital imaging system 270 can be characterized (e.g., by capturing an image of a grid having a known geometry), and the captured digital image 325 can be adjusted to compensate for the geometric distortions as part of the process of determining the spatial relationships 350. The compensation can be done as part of the analyze digital image step 330 or the determine spatial relationships step 345.

Next, an advance frame to test fixture step 360 is used to advance the web of substrate 150 along the web transport path 205 (FIG. 10) until the frame 300 is proximate to the electrical test fixture 220. As discussed earlier with reference to FIG. 10, the electrical test fixture 220 includes a set of test probes 222, 224 adapted to make electrical contact with corresponding test pads 310 of the associated device (e.g., touch sensor 530 in FIG. 11). In a preferred embodiment, the web of substrate 150 is stopped at a position where the test pads 310 would be aligned with the test probes 222, 224 if the device is positioned in its nominal location on the web of substrate 150. Preferably, the web of substrate 150 is clamped in a fixed position once it has stopped (e.g., using clamps 245 in FIG. 10) to prevent any further movement of the web of substrate 150 until after the electrical test has been performed.

In sense fiducial marks step 365, the fiducial sensing system 250 (FIG. 10) is used to sense positions of the fiducial marks 305 to determine sensed fiducial mark positions 370, preferably while the web of substrate 150 is stopped. As discussed earlier, in an exemplary embodiment the fiducial sensing system 250 includes a plurality of fiducial sensors 251, 252 having corresponding fields-of-view 253, 254 large enough to detect the fiducial marks 305 given the expected range of system variability. In some embodiments the fiducial sensors 251, 252 are digital camera systems which capture digital images of the portion of the web of substrate including the fiducial marks 305. The sensed fiducial mark positions 370 can then be determined by automatically analyzing the captured digital images. For example, the centroids of the fiducial marks 305 in the captured digital images can be determined and used to define the sensed fiducial mark positions 370. A calibration process can be used during a system configuration stage to accurately relate the pixel positions within the captured digital images to actual physical locations within the electrical test fixture 220 (FIG. 10).

Next, an adjust test fixture position step 375 is used to adjust a position of the electrical test fixture 220 (FIG. 10) responsive to the spatial relationships 350 between the positions of test pads 310 and the positions of the fiducial marks 305 in the captured digital image 325, together with the sensed fiducial mark positions 370 so that the test probes 222, 224 (FIG. 10) are properly aligned with the corresponding test pads 310. In an exemplary embodiment, predicted positions of the test pads 310 are determined by using the relative position information specified by the spatial relationships 350 to estimate the predicted positions of the test pads 310 relative to the sensed fiducial mark positions 370. In order to increase the reliability of aligning the test probes 222, 224 with corresponding test pads 310 it is advantageous for the predicted position of each test pad 310 to correspond to a central position (e.g., a centroid) within the test pad 310. This can be accomplished by computing centroids of the fiducial marks 305 and the test pads 310 during the determination of the spatial relationships 350 and the sensed fiducial mark positions.

The positions of the test probes 222, 224 are generally not individually adjustable but are moved as a unit. Therefore, once the predicted positions of the test pads 310 are determined, the position of the electrical test fixture 220 is adjusted to align the test probes 222, 224 with the predicted positions of the test pads 310. In various embodiments, the adjustment of the test fixture position can include translating the electrical test fixture 220 within a plane parallel to a surface of the web of substrate 150 (FIG. 10), as well as rotating the electrical test fixture 220 about an axis that is perpendicular to a surface of the web of substrate 150.

In some embodiments, alignment parameters specifying the amount of translation and rotation that should be applied to the electrical test fixture are determined by using a fitting process (e.g., a well-known least squares analysis) based on the predicted positions of the test pads 310 and known positions of the test probes 222, 224 associated with a predefined test probe configuration within the electrical test fixture 220. For example, the alignment parameters can include translation parameters specifying distances in the x- and y-directions (FIG. 9) for moving the electrical test fixture 220, and a rotation parameter specifying an angle θ for rotating the electrical test fixture 220. The adjust test fixture position step 375 then adjusts the position of the electrical test fixture 220 responsive to the determined alignment parameters. In some embodiments, the positions of the upper test bed 221 and the lower test bed 223 of the electrical test fixture 220 can be independently adjusted. In such cases, the alignment parameters can include separate sets of alignment parameters for adjusting the positions of the upper test bed 221 and the lower test bed 223.

A move test probes to contact test pads step 380 is used to move the test probes 222, 224 (FIG. 10) into electrical contact with the corresponding test pads 310. In some embodiments this is accomplished by lowering the upper test bed 221 (FIG. 10) until the associated test probes 222 come into electrical contact with the test pads 310 on the first side 151 of the web of substrate 150. Likewise, the lower test bed 223 can be raised until the associated test probes 224 come into electrical contact with the test pads 310 on the second side 152 of the web of substrate 150. In other cases, different mechanisms can be used to extend the test probes 222, 224 into electrical contact with the corresponding test pads 310.

In perform electrical test step 385 an electrical test of the device(s) contained within the frame 300 is performed using the test instrument 240 (FIG. 4) associated with the set of test probes 222, 224 (FIG. 10). In some embodiments, the electrical test can include verifying that there is electrical connectivity between appropriate pairs of test pads 310, and that there are no undesired shorts between other pairs of test pads 310. In other embodiments, electrical characteristics such as resistance, capacitance or inductance can be measured between pairs of test pads 310 to make sure that they fall within expected ranges. In some cases, performing the electrical test can include applying an appropriate electrical signal (e.g., a voltage or a current) to one or more of the test pads 310, and measuring a corresponding response at other test pads 310.

After the electrical test step 385 is completed, the results can be recorded using an appropriate means (e.g., by storing the results in memory 265). The web of substrate 150 can then be advanced to test the devices on the next frame 300.

The steps of FIG. 12 can then be repeated for each successive frame 300 on the web of substrate 150.

Returning to a discussion of FIG. 11, a top view of three frames 300a, 300b and 300c is illustrated, where frame 300a has already reached electrical test fixture 220 and is positioned so that its fiducial marks 531, 532 are within the fields-of-view 253, 254 of fiducial sensors 251, 252 (FIG. 10), so that their positions can be sensed by the fiducial sensing system 250 (FIG. 10). Frame 300c is proximate digital imaging system 270 (FIG. 10) and is positioned for the line-scan camera 271 to sequentially capture line images 275 as frame 300c is advanced past the line-scan camera 271 along media advance direction 208. Frame 300b is intermediate in position between digital imaging system 270 (FIG. 10) and electrical test fixture 220. Line images 275 for frames 300a and 300b were previously captured when they passed through the current position of frame 300c.

Note in frame 300a that fiducial mark 531 is spaced apart from fiducial mark 532 along the media advance direction 208, so that the fiducial sensing system 250 can make an accurate determination of the actual distance D1 between fiducial marks 531 and 532. In some embodiments, the value of D1 determined by the fiducial sensing system 250 can be used to calibrate the encoder signal from the surface encoder 274. Any inaccuracies in the calibration of the encoder signal will result in a difference between the actual distance D1 between the fiducial marks 531 and 532 determined by the fiducial sensing system 250 and a corresponding distance between the fiducial marks 531 and 532 in the digital image captured by the line-scan camera 271. The ratio of the distances determined by the fiducial sensing system 250 and the line-scan camera 271 can be used to provide a scale factor for adjusting the calibration of the surface encoder 274 so that the distance d that the web of media 150 is advanced between capturing sequential image lines 275 will be more accurate.

For purposes of illustration of both types of optical sensing, FIG. 11 shows the fields-of-view 253, 254 of the fiducial sensors 251, 252 centered around the fiducial marks 531, 532, respectively, for frame 300a at the same time that line images 275 for frame 300c are being captured by the line-scan camera 271. However, in practice, the fiducial marks 531, 532 will be centered within the fields-of-view 253, 254 when the web of substrate 150 is stopped and clamped by clamps 245 (FIG. 10). In contrast, the line images 275 will be captured by the line-scan camera 271 when frame 300c on the web of substrate 150 is moving past the line-scan camera 271. In an exemplary embodiment, a distance is provided between the line-scan camera 271 and the fiducial sensing system 250 (FIG. 10) such that when the fiducial marks 531, 532 of a particular frame (e.g., frame 300a) are proximate the associated fiducial sensors 251, 252 and the web of substrate 150 is stopped, a field-of-view of the line-scan camera 271 is positioned at an inter-frame region between two successive frames (such as frames 300b and 300c). The inter-frame region can include a frame boundary 546, and, in general, does not include the fiducial marks 531, 532 or portions of the touch sensor 530 for any of the successive frames. In this way, the capturing of the digital image 325 (FIG. 12) by the digital imaging system 270 is not interrupted when the web of substrate 150 is stopped.

In a preferred embodiment, the fiducial sensors 251, 252 of the fiducial sensing system 250 (FIG. 10) are digital camera systems, where the fields-of-view 253, 254 of the digital camera systems are larger than an expected variability in the position of the corresponding fiducial marks 531, 532. Additionally, in a preferred embodiment, each of digital camera systems has a field-of-view that is smaller than a field-of-view of the digital imaging system 270. (For the case where the digital imaging system 270 uses a line-scan camera 271, the "field-of-view" of the digital imaging system 270 can be considered to correspond to the area of the composite digital image formed by combining a plurality of image lines rather than the field-of-view of the line-scan camera 271, which would correspond to a particular image line 275.) The field-of-view of the digital imaging system 270 is preferably arranged to include at least a portion of a particular frame 300c that includes the test pads (connector pads 558, 568 and probe pads 559, 569) of the particular device together with the fiducial marks 531, 532. One reason that the fields-of-view 253, 254 of the fiducial sensors 251, 252 will generally be relatively small is that the components of the electrical test fixture 220 will typically block the central region of the frame 300a that includes the device (i.e., touch sensor 530) from view.

The examples above have described the use of two fiducial sensors 251, 252 to determine the positions of two fiducial marks 531, 532 that are spaced apart along the media advance direction 208. In other embodiments, three or more fiducial sensors can be used to determine the positions of a corresponding set of fiducial marks. A series of three or more fiducial marks can be positioned along a straight line within the frame 300 in order to sense and compensate for distortion at a more local scale within the frame using a corresponding series of fiducial sensors. In another implementation of three or more fiducial marks (e.g., fiducial marks 531, 532, 533 and 534), the fiducial marks and corresponding fiducial sensors are not arranged along a straight line, and can be used to compensate for distortion along more than one direction. This will enable more accurate determination of any distortions introduced into the web of media 150 which can cause the features of the device (i.e., the touch sensor 530) to be moved from their nominal positions. In turn, this will enable more accurate determination of predicted test pad positions, in both the in-track direction (i.e., the x-direction in FIG. 9) and the cross-track direction (i.e., the y-direction in FIG. 9).

For testing of devices such as touch sensors 530 having a first set of test pads (connector pads 558 and probe pads 559) that are printed on a first side 151 of web of substrate 150 by a first print module 130 of flexographic printing system 100 (FIG. 1) and a second set of test pads (connector pads 568 and probe pads 569) that are printed on a second side 152 of web of substrate 150 by a second print module 140 of flexographic printing system 100, it is preferable to have a first set fiducial marks 531, 532 printed by the first print module 130 on the first side 151, and a second set of fiducial marks 533, 534 printed by the second print module 140 on the second side 152. This requires two additional fiducial sensors (not shown in FIG. 10), but it eliminates a source of error that would be introduced if the fiducial marks used to determine predicted test pad positions for the test pads printed on a particular side (e.g., second side 152) were not printed by the same printing station that is used to print the test pads (e.g., connector pads 568 and probe pads 569) on that side of the web of substrate 150.

Figure 13:
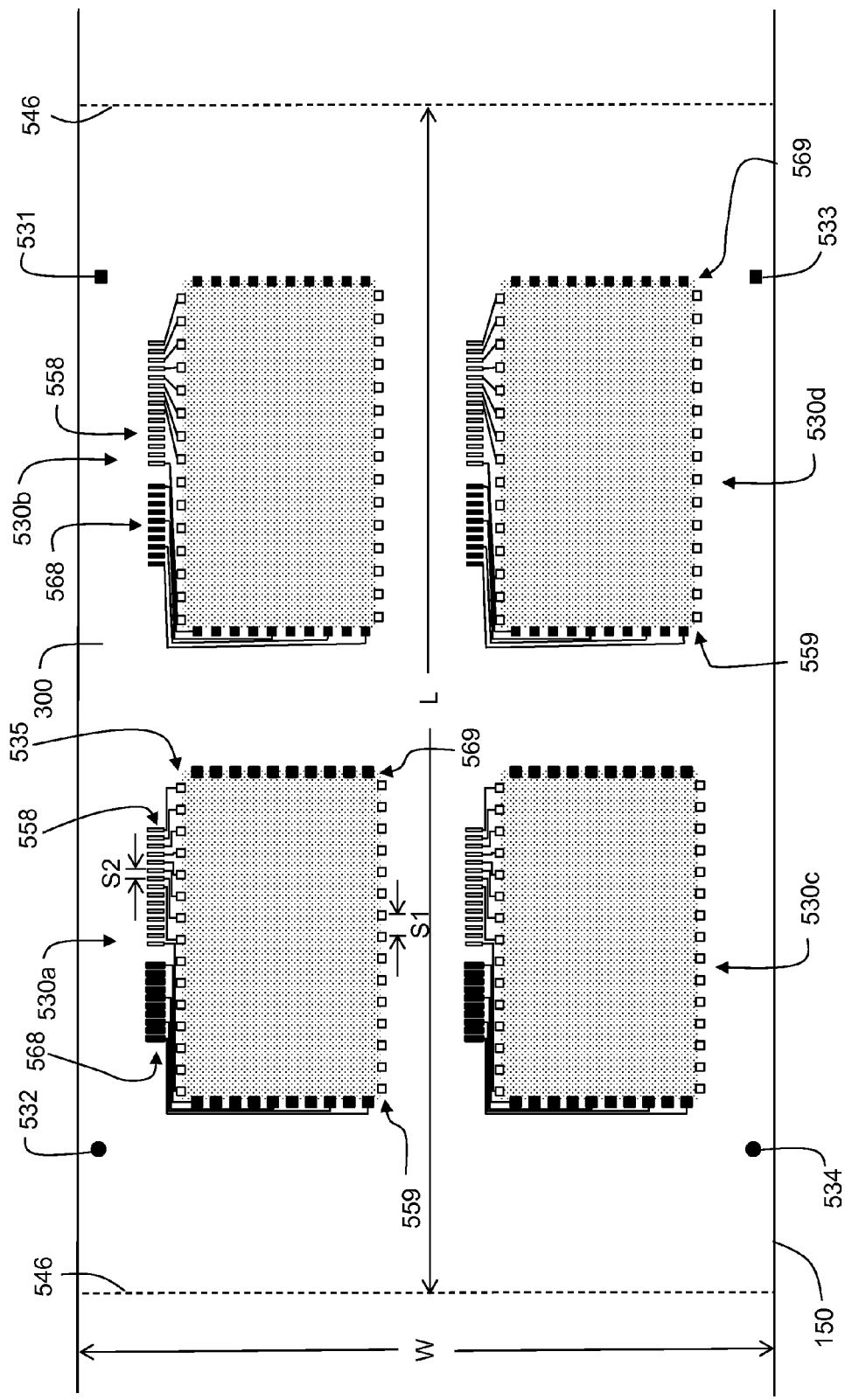
FIG. 13 is a top view of a frame containing multiple touch sensors in the same orientation.

In the examples described above, each frame 300 has contained only one touch sensor 530. In other embodiments, a single frame 300 can include a plurality of touch sensors 530 depending upon the size of an individual device relative to the size of a frame. FIG. 13 shows an example where a single frame 300 contains four touch sensors 530a, 530b, 530c, 530d. The width W of a frame 300 is typically the width of the web of substrate 150, which can be around 14 inches, although narrower webs and wider webs are also possible. The length L of a frame 300 that has been printed using flexographic printing system 100 (FIG. 1) generally corresponds to the circumference of a plate cylinder, such as plate cylinder 111, which can be around 18 inches. Depending upon the size of the touch sensor 530, it can be cost effective to have a plurality of touch sensors within each frame 300.

In the example shown in FIG. 13, probe pads 559 are spaced at a first spacing S1 and connector pads 558 are spaced at a second spacing S2 that is less than S1. Similarly connector pads 568 are spaced at a smaller spacing than that of probe pads 569. This is because it is desired to use a small connector (not shown) when the touch sensor 530 is integrated into a touch screen. Connector pads 558 and 568 are typically located at or near an edge 535 of the touch sensors 530a, 530b, 530c, 530d to facilitate attachment of the connector.

Figure 14:
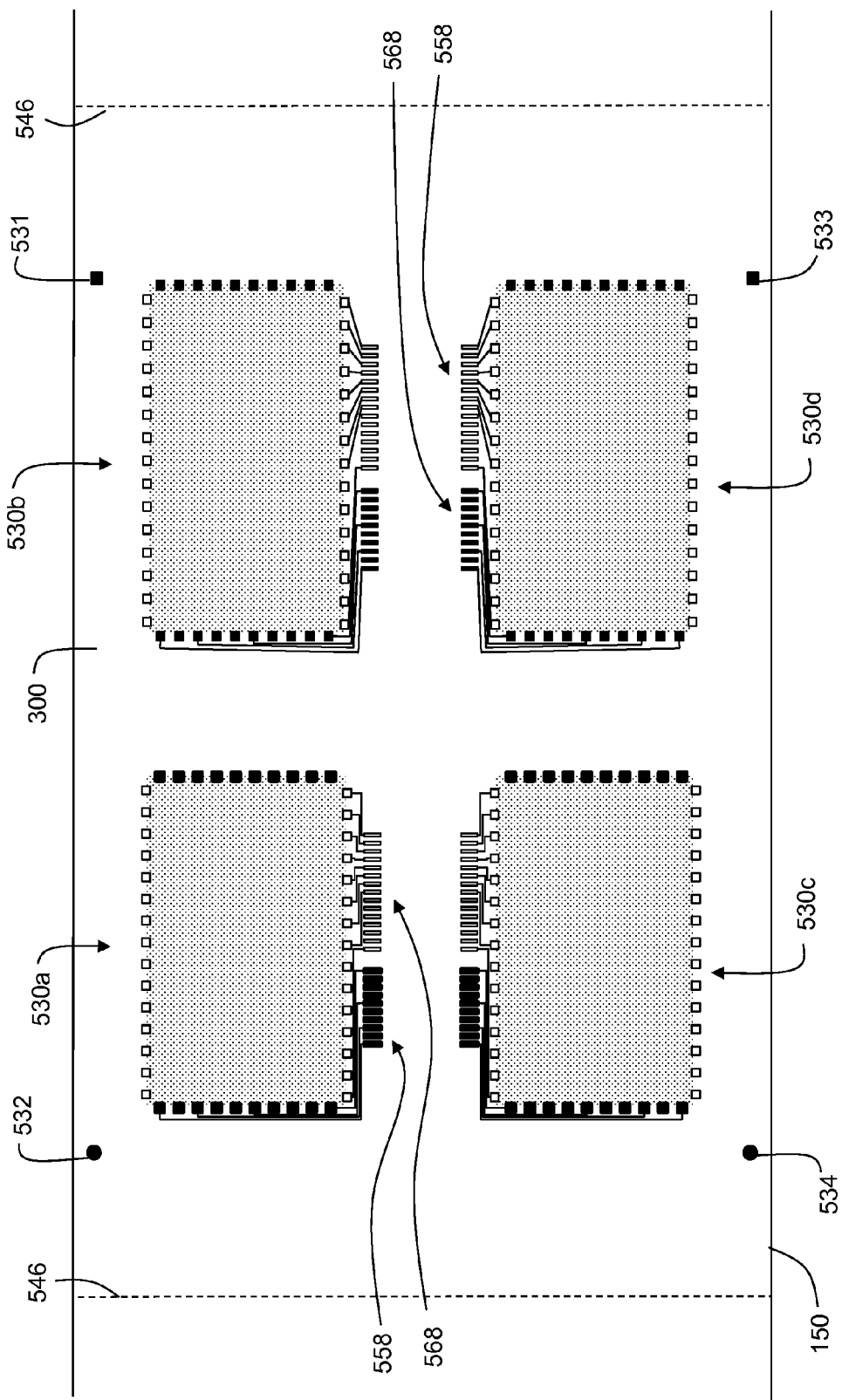
FIG. 14 is similar to FIG. 13, except that two of the touch sensors are rotated by 180 degrees.

When all four touch sensors 530a, 530b, 530c, 530d in frame 300 are oriented in the same orientation as in FIG. 13, some tightly spaced connector pads 558, 568, such as those associated with touch sensors 530a and 530b, can be located comparatively close to the fiducial marks 531, 532 on the first side 151 of the web of substrate 150 and comparatively far from the fiducial marks 533, 534 on the second side 152 of the web of substrate 150. Since the accuracy of the determination of the predicted test pad positions will be related to their distance from the corresponding fiducial marks, this can result in some of the predicted test pad positions having a significantly lower level of accuracy. The accuracy in the determination of the predicted test pad positions of the tightly spaced connector pads 558, 568 can be improved by configuring the layout of the touch sensors 530a, 530b, 530c and 530d as in FIG. 14, where the tightly spaced connector pads 558, 568 for touch sensors 530a and 530b are near the tightly spaced connector pads 558, 568 for touch sensors 530c and 530d, both being positioned roughly halfway across the width of web of substrate 150. This can be achieved by laying out the flexographic printing plates for the flexographic printing system 100 (FIG. 1) such that the orientation of touch sensors 530a and 530b is rotated by 180 degrees relative to the orientation of touch sensors 530c and 530d.

In some cases, the distortion of the web of substrate 150 may be such that it would not be possible to simultaneously align all of the test probes 222, 224 with their corresponding test pads (e.g., connector pads 558, 568 and probe pads 559, 569). In this case, it may be desirable to align the electrical test fixture 220 with one of the touch sensors 530a, 530b, 530c, 530d at a time. For example, the test probes 222, 224 can first be aligned with the test pads (e.g., connector pads 558, 568 and probe pads 559, 569) of touch sensor 530a so that that device can be tested. The position of the electrical test fixture 220 can then be adjusted to align with the test pads of touch sensors 530b, 530c and 530d so that they can be tested in sequence. In this way, each of the touch sensors 530a, 530b, 530c, 530d can be tested individually despite the fact that they could not be tested simultaneously.

Further improvements in reliability of positioning the electrical test fixture 220 relative to the test pads (e.g., connector pads 558, 568 and probe pads 559, 569) can make use of an adaptive learning process to compensate for errors in the systematic deviations in the positions of individual test probes 222, 224 (FIG. 10). For example, in a set-up process, the centroids of the test pads can be determined and the electrical test fixture can be moved to a first position corresponding to an ideal position that would cause each test probe 222, 224 to contact the corresponding test pad at its centroid, assuming zero error in the positioning of the individual test probes 222, 224. In this first step it can be confirmed that there are no electrical defects. Then the electrical test fixture 220 can be moved by a distance that is less than, but approximately equal to, half the width of a narrow test pad (e.g., a connector pad 558) in the +x direction to check whether any test probes 222 or 224 have lost contact with the corresponding test pad. Similar tests can be done using small movements in the −x direction, the +y direction, and the −y direction. Through such an adaptive learning process, it can be determined which particular test probes 222, 224 have the greatest positional error in the various directions and how large the errors are. A modified amount of motion of the electrical test fixture 220 can thereby be determined such that reliable contact of the overall set of test probes 222, 224 can be established, taking into account the systematic errors in the test probe positions, as well as image distortion and web distortion.

Figure 15B:
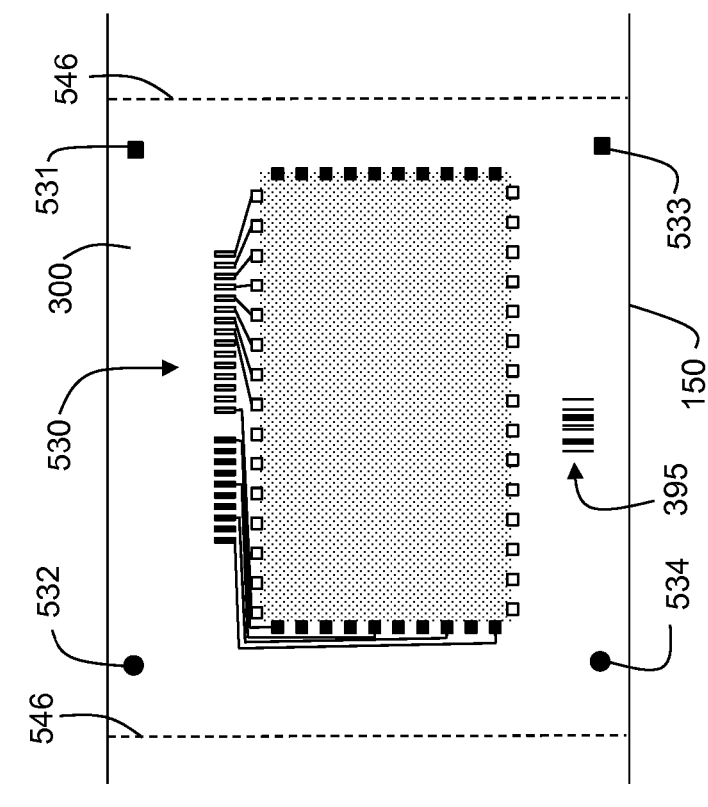
FIG. 15B illustrates coupling the device with the test result using an identification code for the device.
Figure 15A:
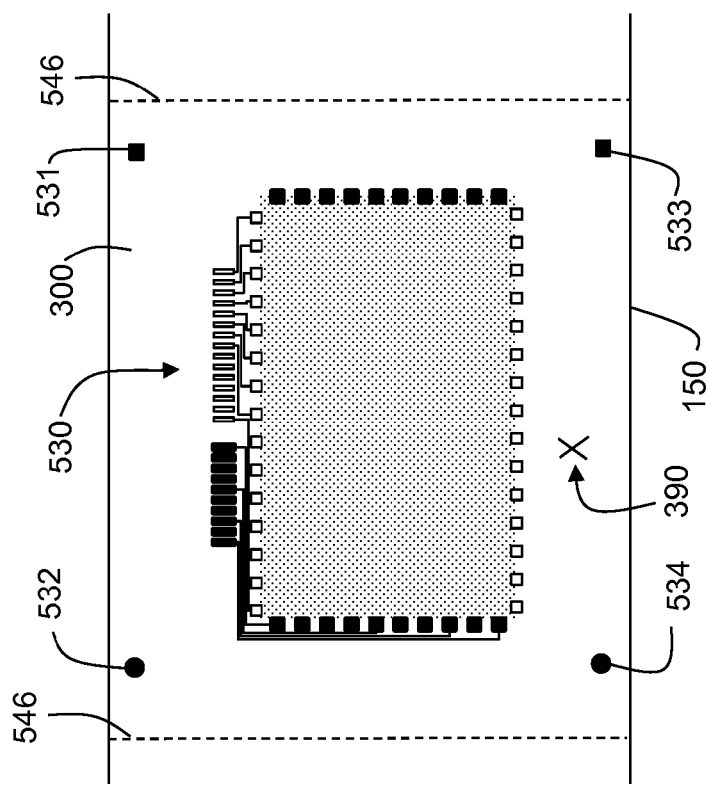
FIG. 15A illustrates coupling the device with the test result by providing a mark near the device.

After the electrical test is performed at perform electrical test step 385 (FIG. 12), the result of the electrical test (for example, "pass" or "fail") needs to be coupled with the corresponding device that was tested. One method of coupling the test result with the corresponding device is shown in FIG. 15A. In this case, a physical mark 390 is formed on the web of substrate 150 proximate to the device (e.g., touch sensor 530) providing an indication of whether the device passed or failed the electrical test. The physical mark 390 can be formed using any process known in the art, such as applying ink to the web of substrate 150, or using a laser to burn a mark on the web of substrate 150 or to form a hole in the web of substrate 150. The physical mark 390 can subsequently be detected for separating the good and bad devices. In some embodiments, no mark can be formed if the device passes the electrical test, and a mark can be formed if the device fails the electrical test (or vice versa). In other embodiments, different marks can be formed depending on whether or not the device passes the electrical test.

Alternatively, a unique identification code can be associated with each device. In this case, the step of coupling each device with the result of the electrical test can include storing an electrical test result in memory 265 (FIG. 10), together with the identification code for that device. FIG. 15B shows an example where the identification code associated with each device is represented using a bar code 395 formed on the web of substrate 150 in proximity to the device (e.g., touch sensor 530). In other cases, the identification code can simply provide an indication of a location of the device on the web of media 150, and indication of the identification code may not be physically formed onto the web of media 150.

As indicated above, exemplary embodiments of the invention include a roll-to-roll electrical testing system and associated method where an electrical test fixture is aligned to test pads formed on a web of substrate 150 using a digital imaging system 270 for capturing a digital image of at least the test pads of a particular device (e.g., touch sensor 530) plus associated fiducial marks 531, 532 in order to establish their spatial relationships, and also using a separate fiducial sensing system 250 for sensing positions of the associated fiducial marks 531, 532. Analogous types of systems and methods can be used for performing various other types of operations on an article having a plurality of fiducial marks and a set of features as described below.

Figure 16:
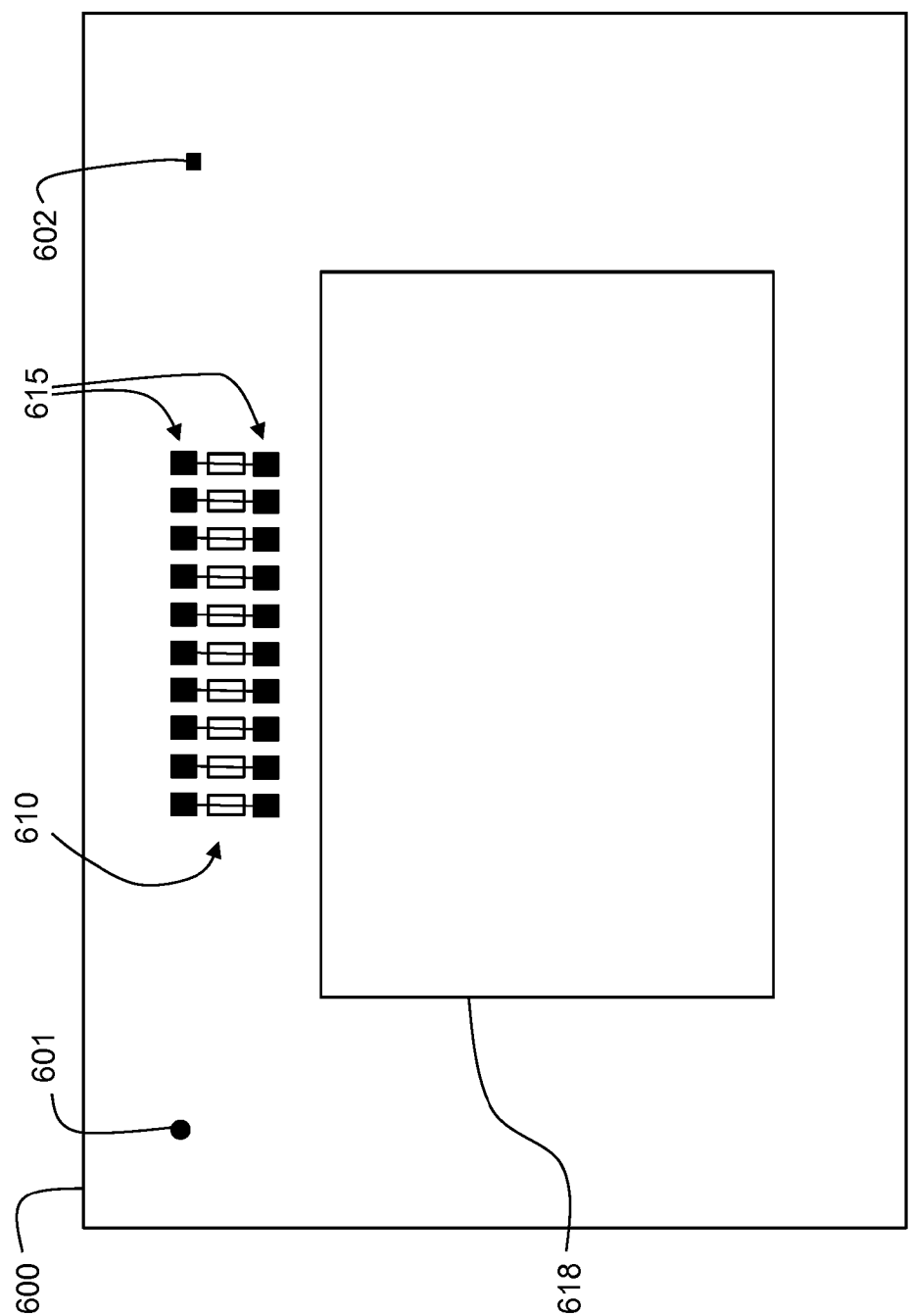
FIG. 16 shows an example of an article including fuses on which a fuse blowing operation is to be performed.

FIG. 16 shows a top view of an article 600 having fiducial marks 601, 602 and a set of probe pads 615 (which can generically be called a set of "features") connected to an array of fuses 610 that are associated with a circuit 618. In some embodiments, the state of fuses 610 (open or shorted) can affect the operation of circuit 618. In other embodiments, the state of the fuses 610 can serve as an electrically readable code. In an exemplary embodiment, the fuses 610 are selectively "blown" to configure the article 600 to have a desired state (e.g., to store a desired code). Subsequently, it can be useful to electrically read the state of the fuses (e.g., to read the code). In either case, a system 630 such as that shown in FIG. 17, which is similar to the electrical test system 210 (FIG. 10), can be used. While the system 630 includes a web transport system including a supply roll 202, a take-up roll 204, and rollers 206 and 207, these components would only be included in such a system 630 if the article 600 is formed on a flexible web. In other embodiments (not shown) the article 600 can be formed on a rigid substrate and would require appropriate transport system components for transporting and positioning the article 600 within the system 630. Examples of such transport systems would include a conveyor belt with vacuum hold down or electrostatic hold down, or a substrate holder with mechanical clamps for holding the article 600 in a fixed position relative to the transport system.

Figure 17:
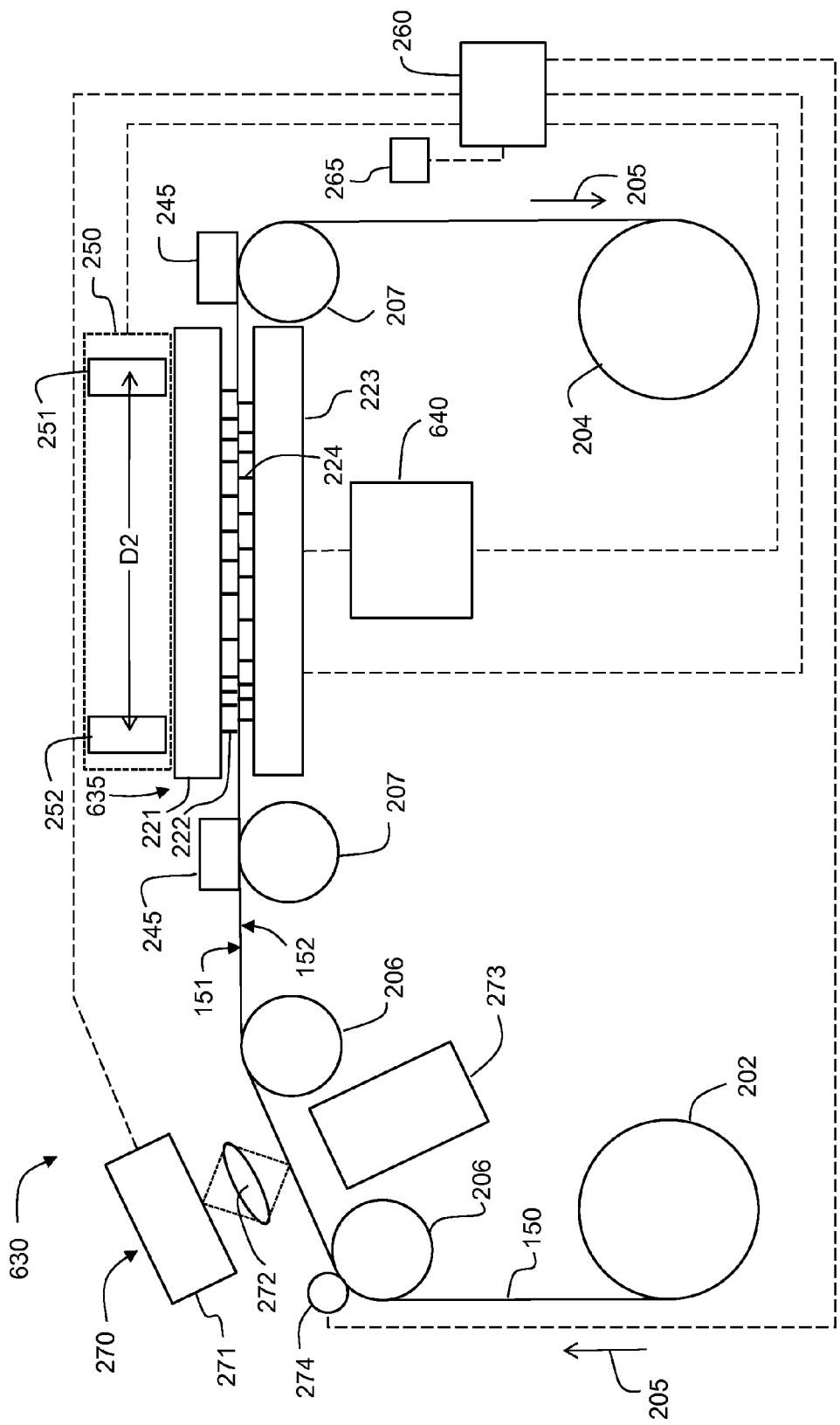
FIG. 17 is a schematic side view of a roll-to-roll system for performing an operation on an article according to an embodiment of the invention.

With reference to FIGS. 16 and 17, an exemplary embodiment will be described where the system 630 is used to perform the operations of blowing or testing fuses 610. Digital imaging system 270 is configured to capture a digital image of at least a portion of the article 600 that includes a set of features (e.g., the probe pads 615) and the fiducial marks 601, 602, and fiducial sensing system 250 is configured to sense positions of the fiducial marks 601, 602. An instrument 635 is configured to perform the desired operation on the article 600, and includes both upper test bed 221 and lower test bed 223 with respective test probes 222, 224, as well as an electrical fixture 640 adapted to controllably apply electrical signals through the test probes 222, 224 to perform the desired operations. For example, to selectively blow the fuses 610, the electrical fixture 640 can controllably apply sufficiently high voltages across the fuses 610 through the probe pads 615. Similarly, to test the state of the fuses 610, the electrical fixture 640 can be used to test the electrical continuity between pairs of probe pads 615 as in the embodiments for roll-to-roll testing of touch sensors 530 described above. Controller 260 is configured to control the components of the system 630 to perform the desired operation(s).

Other aspects of the system 630 for performing an operation on an article can be similar to those in embodiments described above relative to the roll-to-roll electrical test system 210 described relative to FIGS. 10 and 11. For example, in some embodiments, the digital imaging system 270 can include a line-scan camera 271 configured to capture a set of successive image lines 275 as the article 600 is moved past the line-scan camera 271, such that the set of successive image lines are combined to provide a composite digital image. The digital imaging system 270 can also include a surface encoder 274 that is configured to contact a surface of the article 600 and provide an encoder signal representing a position of the article 600, where a timing for capturing the successive image lines 275 is determined responsive to the encoder signal. As described earlier, in some embodiments, a difference between sensed positions of the fiducial marks 601, 602 by the fiducial sensing system 250 can be used to calibrate the encoder signal.

Other aspects of the system 630 that can be similar to the electrical test system 210, include the use of a plurality of digital camera systems in the fiducial sensing system; the field-of-view size being larger than the expected variability in the position of the fiducial mark; and the field-of-view of the digital camera systems being smaller than the field-of-view of the digital imaging system 270.

Some aspects of the generalized system may also be different, depending upon the nature of the article 600 as well as the way the generalized system functions. In the roll-to-roll electrical test system 210 described with reference to FIGS. 10 and 11, the web transport system advances the web of substrate 150 along a media advance direction 208. In some embodiments of the generalized system, it is necessary to move the article 600 in a forward direction and then in a reverse direction. For example, for testing and trimming the resistor array shown below in FIG. 19, article 600 can be moved forward from an electrical testing station to a laser trimming station and then backward to the electrical testing station for a post-trimming electrical test. In such an embodiment, errors in the reading of the surface encoder 274 can be increased due to slippage or play during the reversal of direction. This can increase the need for a fiducial sensing system 250 to accurately position that article for each operation and to provide calibration of the digital imaging system. Another difference relative to electrical test system 210 of FIG. 10 is that if article 600 is not transparent, a change in the placement of light source 273 can be required.

One further difference in the generalized system 630 is that adjustment of position (such as translation or rotation) can either be done for the instrument 635 or for the article 600, depending on the nature of the article 600 and the configuration of the system 630. In some embodiments, translation of the article 600 can be done on a conveyor belt or a translation stage (not shown), and rotation of the article 600 can be done using a rotational stage (not shown).

Figure 18:
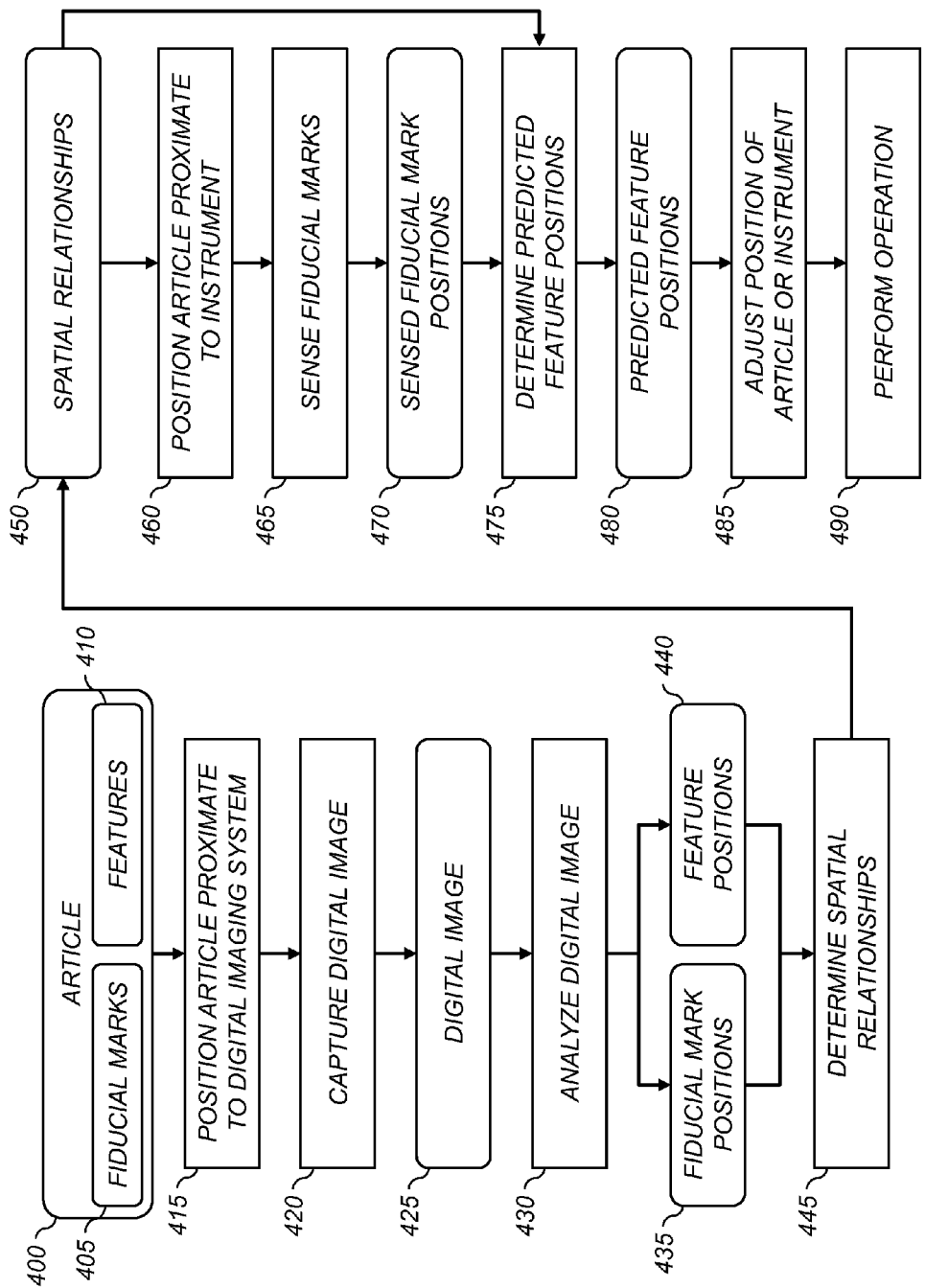
FIG. 18 is a flow diagram for a generalized method of performing an operation on an article according to an embodiment of the invention.

A generalized method for using an instrument 635 to perform an operation on an article 400 including a plurality of fiducial marks 405 and a set of features 410 is described relative to the system 630 of FIG. 17 and the flow diagram shown in FIG. 18. In an exemplary embodiment, some or all of the steps of the method are performed by using the controller 260 to control the appropriate components of the system 630 and to perform associated analysis operations.

In position article proximate to digital imaging system step 415, the article 400 is positioned in proximity to the digital imaging system 270. In the illustrated roll-to-roll configuration, this step can be performed by advancing the web of substrate 150 along the web transport path 205 until a particular article 400 is proximate to the digital imaging system 270. A capture digital image step 420 is used to capture a digital image 425 using the digital imaging system 270. The digital image 425 includes at least a portion of the article 400 that includes the associated fiducial marks 405 and the features 410. In the illustrated configuration, the digital imaging system 270 includes a line-scan camera 271 which captures the digital image 425 line-by-line as the article 400 is moved past the line-scan camera 271. In other embodiments, the digital imaging system 270 can use a two-dimensional digital camera.

An analyze digital image step 430 is then used to automatically analyze the captured digital image 425 using controller 260 to determine fiducial mark positions 435 and feature positions 440 within the captured digital image 425. The fiducial mark positions 435 and the feature positions 440 can be determined and represented using any method known in the art. In exemplary embodiments, the fiducial mark positions 435 and the feature positions 440 are determined by detecting the corresponding fiducial marks 405 and the features 410 (e.g., probe pads 615) using any appropriate feature detection method. Centroids of the detected fiducial marks 405 and the features 410 are then computed, and the x-y pixel positions of the centroids within the digital image 425 are used to represent the corresponding fiducial mark positions 435 and the feature positions 440. Methods for analyzing a digital image to detect the fiducial marks 405 and the features 410, and methods for computing corresponding centroids will be well-known to those skilled in the art and any such method can be used in accordance with the present invention.

A determine spatial relationships step 445 is then used to determine spatial relationships 450 between the determined feature positions 440 of the features 410 and the determined fiducial mark positions 435 of the fiducial marks 405 in the captured digital image 425. As described earlier with reference to FIG. 12, the spatial relationships 450 can be represented using any appropriate method known in the art. For cases where the optical system associated with the digital imaging system 270 introduces geometrical distortions into the captured digital image 425, the captured digital image 425 can be adjusted to compensate for the geometric distortions as part of the process of determining the spatial relationships 350. The compensation can be done as part of the analyze digital image step 430 or the determine spatial relationships step 445.

Next, a position article proximate to instrument step 460 is used to reposition the article 400 so that it is proximate to the instrument 635 which will perform the operation on the article 400. In the illustrated roll-to-roll configuration, this step can be performed by advancing the web of substrate 150 along the web transport path 205 until the article 400 is proximate to the instrument 635. As discussed earlier with reference to FIG. 10, the exemplary instrument 635 includes a set of test probes 222, 224 adapted to make electrical contact with corresponding features 410 (e.g., probe pads 615) of the associated article 400. In a preferred embodiment, the web of substrate 150 is stopped at position where the features 410 would be aligned with the test probes 222, 224 if the article 400 is positioned in its nominal location on the web of substrate 150. Preferably, the web of substrate 150 is clamped in a fixed position once it has stopped (e.g., using clamps 245) to prevent any further movement of the web of substrate 150 until after the operation has been performed.

In sense fiducial marks step 465, the fiducial sensing system 250 is used to sense positions of the fiducial marks 405 to determine sensed fiducial mark positions 470, preferably while the article 400 is in a fixed position. As discussed earlier, in an exemplary embodiment the fiducial sensing system 250 includes a plurality of fiducial sensors 251, 252 having corresponding fields-of-view 253, 254 large enough to detect the fiducial marks 405 given the expected range of system variability. In some embodiments the fiducial sensors 251, 252 are digital camera systems which capture digital images of the portion of the web of substrate including the fiducial marks 405. The sensed fiducial mark positions 470 can then be determined by automatically analyzing the captured digital images. For example, the centroids of the fiducial marks 405 in the captured digital images can be determined and used to define the sensed fiducial mark positions 470. A calibration process can be used during a system configuration stage to accurately relate the pixel positions within the captured digital images to actual physical locations within the instrument 635.

A determine predicted feature positions step 475 is used to determined predicted feature positions 480 of the features 410 using the relative position information specified by the spatial relationships 450 to estimate the predicted positions of the features 410 relative to the sensed fiducial mark positions 470. In an exemplary embodiment, the predicted feature positions 480 correspond to central position (e.g., a centroid) within the features 410.

Next, an adjust position of article or instrument step 485 is used to adjust a position of the instrument 635 or the article 400 responsive to the predicted feature positions 480 so that the instrument 635 is properly positioned to perform the operation on the article 400. In an exemplary embodiment, the position of the instrument 635 is adjusted so that the test probes 222, 224 are properly aligned with the corresponding features 410 (e.g., probe pads 615).

In an exemplary embodiment, the elements of the instrument 635 (e.g., test probes 222, 224) are not individually adjustable but must be moved as a unit. Therefore, once the predicted positions of the features 410 are determined, the position of the instrument 635 is adjusted to align the test probes 222, 224 with the predicted positions of the features 410. In various embodiments, the adjustment of the position of the instrument 635 can include translating the instrument 635 within a plane parallel to a surface of the web of substrate 150, as well as rotating the instrument 635 about an axis that is perpendicular to a surface of the web of substrate 150.

In some embodiments, alignment parameters specifying the amount of translation and rotation that should be applied to the instrument are determined by using a fitting process (e.g., a well-known least squares analysis) based on the predicted feature positions 480 and known positions of the test probes 222, 224 associated with a predefined test probe configuration within the instrument 635. For example, the alignment parameters can include translation parameters specifying distances in the x- and y-directions (FIG. 9) for moving the instrument 635, and a rotation parameter specifying an angle θ for rotating the instrument 635. The adjust position of article or instrument step 485 then adjusts the position of the instrument 635 responsive to the determined alignment parameters. In some embodiments, the positions of various components of the instrument 635 (e.g., the upper test bed 221 and the lower test bed 223) can be independently adjusted. In such cases, the alignment parameters can include separate sets of alignment parameters for adjusting the positions of the different components.

In perform operation step 490, the desired operation is performed on the article 400 using the instrument 635. As described earlier with respect to FIG. 16, in an exemplary embodiment the operation can include bringing the test probes 222, 224 into contact with the probe pads 615 and applying appropriate electrical signals through the probe pads 615 to selectively blow the fuses 610 or to detect the state of the fuses 610.

In other embodiments, the operation performed by the perform operation step 490 can include adding material to the article 400 using a deposition process or a printing process, for example. In such embodiments there would generally be no test probes 222, 224 to contact the article 400. Rather, the instrument 635 would include one or more deposition or printing devices, such as ink jetting devices that are arranged at predetermined positions. In this case, particular features 410 on article 400 would serve as local alignment targets for material deposition or printing, while fiducial marks 405 serve as global position reference marks. The printing or deposition of material can be for preparing images to be viewed, or for fabricating functional devices, or for forming three dimensional patterns, for example. Alignment of the deposition or printing devices to article 400 is performed as described above using digital imaging system 270 for capturing a digital image of at least the features 410 of a particular article 400 plus associated fiducial marks 405, and a separate fiducial sensing system 250 for sensing positions of the associated fiducial marks 405.

In still other embodiments, the operation performed by the perform operation step 490 can include removing material from the article 400. In various embodiments material removal can be performed using an operation such as an etching process, an ablation process, a drilling process, a milling process or a cutting process.

In still other embodiments, the operation performed by the perform operation step 490 can include cutting the article 400 into multiple pieces (e.g., using a milling operation or a cleaving operation) or attaching the article 400 to another object (e.g., using a gluing operation or a welding operation).

Figure 19:
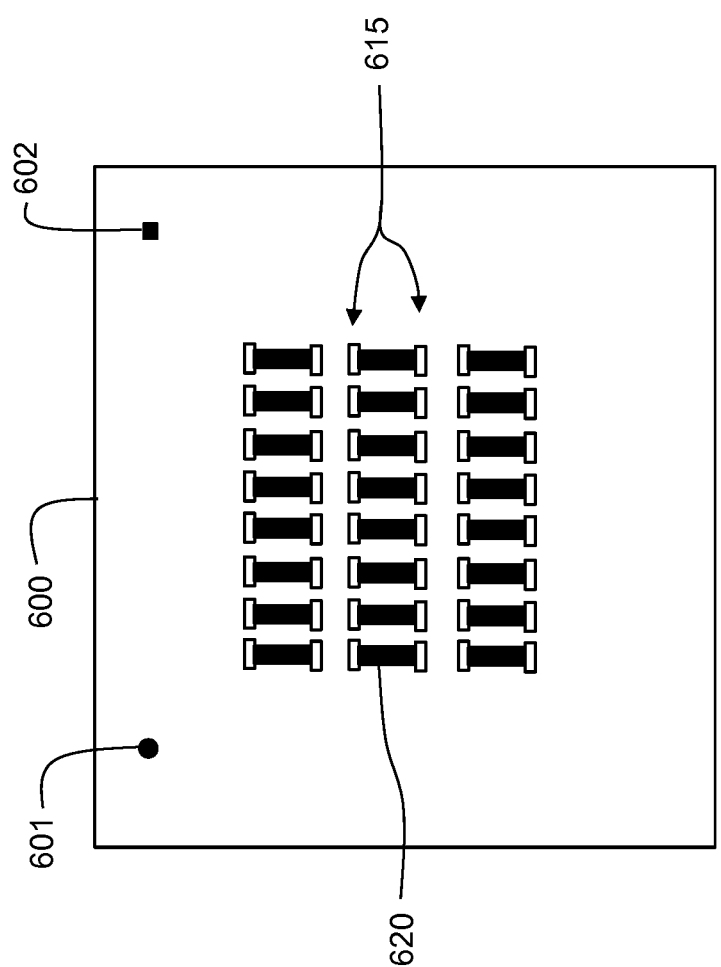
FIG. 19 shows an example of an article including a resistor array on which a material removal operation is to be performed for resistor trimming.

FIG. 19 shows a top view of an exemplary article 600 including an array of resistors 620 with associated probe pads 615, as well as fiducial marks 601, 602. The resistors 620 can be formed by thick film screen printing on a rigid substrate or flexographically printed on a web of substrate 150 (FIG. 1), for example. Variations in resistance values of the resistors 620 can occur due to printing variations or material variations, for example. The resistance values can be brought to their target values by controllably removing resistor material in a process known as resistor trimming. Material can be removed, for example, by laser ablation or by controllably directing jets of abrasive material at the resistors 620. In a first operation, the initial resistance values can be determined via an electrical test where test probes are aligned with probe pads 615 (using adjust position of article or instrument step 485 as described above), and the electrical fixture 640 can apply a known voltage to the probe pads 615 and measure the resulting current. In a second operation, at least one laser or at least one abrasive jet can be aligned with selected resistors 620 (using adjust position of article or instrument step 485 as described above), and the resistors 620 can be trimmed to provide the aim resistance values.

The invention has been described in detail with particular reference to certain preferred embodiments thereof, but it will be understood that variations and modifications can be effected within the spirit and scope of the invention.

PARTS LIST 100 flexographic printing system
102 supply roll
104 take-up roll
105 roll-to-roll direction
106 roller
107 roller
110 print module
111 plate cylinder
112 flexographic printing plate
113 raised features
114 impression cylinder
115 anilox roller
116 UV curing station
120 print module
121 plate cylinder
122 flexographic printing plate
124 impression cylinder
125 anilox roller
126 UV curing station
130 print module
131 plate cylinder
132 flexographic printing plate
134 impression cylinder
135 anilox roller
136 UV curing station
140 print module
141 plate cylinder
142 flexographic printing plate
144 impression cylinder
145 anilox roller
146 UV curing station
150 substrate
151 first side
152 second side
200 electrical test system
202 supply roll
204 take-up roll
205 web transport path
206 roller
207 roller
208 media advance direction
210 electrical test system
220 electrical test fixture
221 upper test bed
222 test probes
222a test probes
222b test probes
223 lower test bed
224 test probes
224a test probes
224b test probes
240 test instrument
245 clamp
250 fiducial sensing system
251 fiducial sensor
252 fiducial sensor
253 field-of-view
254 field-of-view
260 controller
265 memory
270 digital imaging system
271 line-scan camera
272 lens
273 light source
274 surface encoder
275 image line
300 frame
300a frame
300b frame
300c frame
305 fiducial marks
310 test pads
315 advance frame to digital imaging system step
320 capture digital image step
325 digital image
330 analyze digital image step
335 fiducial mark positions
340 test pad positions
345 determine spatial relationships step
350 spatial relationships
360 advance frame to test fixture step
365 sense fiducial marks step
370 sensed fiducial mark positions
375 adjust test fixture position step
380 move test probes to contact test pads step
385 perform electrical test step
390 physical mark
395 bar code
400 article
405 fiducial marks
410 features 415 position article proximate to digital imaging system step
420 capture digital image step
425 digital image
430 analyze digital image step
435 fiducial mark positions
440 feature positions
445 determine spatial relationships step
450 spatial relationships
460 position article proximate to instrument step
465 sense fiducial marks step
470 sensed fiducial mark positions
475 determine predicted feature positions step
480 predicted feature positions
485 adjust position of article or instrument step
490 perform operation step
500 apparatus
510 touch screen
520 display device
530 touch sensor
531 fiducial mark
532 fiducial mark
533 fiducial mark
534 fiducial mark
535 edge
540 transparent substrate
541 first side
542 second side
543 first edge
544 second edge
546 frame boundary
550 conductive pattern
551 fine lines
552 grid
553 fine lines
554 channel pads
555 grid column
556 interconnect lines
558 connector pads
559 probe pads
560 conductive pattern
561 fine lines
562 grid
563 fine lines
564 channel pads
565 grid row
566 interconnect lines
568 connector pads
569 probe pads
580 touch screen controller
600 article
601 fiducial mark
602 fiducial mark
610 fuses
615 probe pads
618 circuit
620 resistor
630 system
635 instrument
640 electrical fixture
D1 spacing
D2 spacing
θ angle

The invention claimed is:

1. An electrical testing system configured to test a series of devices fabricated on successive frames of a web of substrate, each frame including a plurality of fiducial marks and a device having a series of test pads, comprising:
a web transport system for advancing the web of substrate along a web transport path;
an electrical test fixture including a set of test probes adapted to make electrical contact with the test pads of a particular device on the web of substrate;
a test instrument associated with the set of test probes;
a digital imaging system configured to capture a digital image of at least a portion of a particular frame including the test pads of the particular device and the fiducial marks;
a fiducial sensing system including a plurality of fiducial sensors, each adapted to sense a position of an associated fiducial mark; and
a controller configured to:
analyze a digital image captured by the digital imaging system to determine spatial relationships between positions of test pads and positions of the fiducial marks in the captured digital image;
determine positions of the fiducial marks using the fiducial sensing system;
adjust a position of the electrical test fixture responsive to the determined spatial relationships between positions of test pads and positions of the fiducial marks and the determined positions of the fiducial marks so that the test probes are aligned with corresponding test pads;
move the test probes into electrical contact with the test pads; and
perform an electrical test of the particular device using the test instrument.

2. The electrical testing system of claim 1, wherein the digital imaging system includes a line-scan camera configured to capture a set of successive image lines as the web of substrate is moved along the web transport path in a media advance direction, wherein the set of successive image lines are combined to provide the digital image.

3. The electrical testing system of claim 2, wherein the digital imaging system further includes an encoder configured to contact a surface of the web of substrate and provide an encoder signal representing a position of the web of substrate, and wherein a timing for capturing the successive image lines is determined responsive to the encoder signal.

4. The electrical testing system of claim 3, wherein at least two of the fiducial sensors are spaced apart from each other along the media advance direction, and wherein a difference between the positions of the fiducial marks determined using the at least two of the fiducial sensors is used to calibrate the encoder signal.

5. The electrical testing system of claim 2, wherein a distance between the line-scan camera and the fiducial sensing system is provided such that when the fiducial marks of a frame are proximate the associated fiducial sensors, a field-of-view of the line-scan camera is positioned in an inter-frame region between two successive frames.

6. The electrical testing system of claim 1, wherein the fiducial sensors are digital camera systems.

7. The electrical testing system of claim 6, wherein each of the digital camera systems has a field-of-view that is larger than an expected variability in the position of the corresponding fiducial mark.

8. The electrical testing system of claim 6, wherein each of the digital camera systems has a field-of-view that is smaller than a field-of-view of the digital imaging system.

9. The electrical testing system of claim 1, wherein the set of test probes in the electrical test fixture includes:
   a first group of test probes configured to contact a first set of test pads on a first surface of the web of substrate; and
   a second group of test probes configured to contact a second set of test pads on a second surface of the web of substrate.

10. The electrical testing system of claim 1, wherein the adjustment of the position of the electrical test fixture includes translating the electrical test fixture within a plane parallel to a surface of the web of substrate.

11. The electrical testing system of claim 1, wherein the adjustment of the position of the electrical test fixture includes rotating the electrical test fixture about an axis that is perpendicular to a surface of the web of substrate.

12. The electrical testing system of claim 1, wherein the fiducial sensing system is located along the web transport path downstream of the digital imaging system.

13. The electrical testing system of claim 1, wherein the digital imaging system introduces geometric distortions into the captured digital image, and wherein the determination of the spatial relationships between the positions of the test pads and the positions of the fiducial marks includes compensating for the geometric distortions.

14. An article including at least one device that was tested using the electrical testing system of claim 1.

15. The article of claim 14, wherein test pads formed on the at least one device were formed by printing on the web of substrate.

16. The article of claim 14, wherein the printed test pads formed on the at least one device were electrolessly plated.

17. The article of claim 14, wherein the first and second fiducial marks were printed on the web of substrate by a same printing station used to print at least some of the test pads.

18. The article of claim 14, wherein the test pads include:
   a first plurality of test pads corresponding to a first plurality of test probes having a first spacing; and
   a second plurality of test pads corresponding to a second plurality of test probes having a second spacing that is less than the first spacing, the second plurality of test pads is disposed proximate to an edge of the at least one device.

19. The article of claim 18, wherein the article includes at least a first device and a second device formed within the same frame, and wherein the second device is similar to the first device but rotated by 180 degrees such that the second plurality of test pads of the first device are proximate to the second plurality of test pads of the second device.

* * * * *